United States Patent
Nadeau-Dostie et al.

(10) Patent No.: US 6,615,392 B1
(45) Date of Patent: Sep. 2, 2003

(54) HIERARCHICAL DESIGN AND TEST METHOD AND SYSTEM, PROGRAM PRODUCT EMBODYING THE METHOD AND INTEGRATED CIRCUIT PRODUCED THEREBY

(75) Inventors: Benoit Nadeau-Dostie, Aylmer (CA); Dwayne Burek, San Jose, CA (US); Jean-Francois Cote, Chelsea (CA); Sonny Ngai San Shum, San Jose, CA (US); Pierre Girouard, San Jose, CA (US); Pierre Gauther, Aylmer (CA); Sai Kennedy Vedantam, Saratoga, CA (US); Luc Romain, Aylmer (CA); Charles Bernard, Hollister, CA (US)

(73) Assignee: Logicvision, Inc., San Jose, CA (US)

( * ) Notice: Subject to any disclaimer, the term of this patent is extended or adjusted under 35 U.S.C. 154(b) by 384 days.

(21) Appl. No.: 09/626,877

(22) Filed: Jul. 27, 2000

(51) Int. Cl.$^7$ ................................................. G06F 9/45
(52) U.S. Cl. ............................... 716/5; 716/4; 716/18
(58) Field of Search .............................. 716/5, 6, 7, 8, 716/14, 12; 714/726, 728

(56) References Cited

U.S. PATENT DOCUMENTS

| | | | |
|---|---|---|---|
| 4,802,163 A | 1/1989 | Hirabayashi | 371/15 |
| 5,067,091 A | 11/1991 | Nakazawa | 364/490 |
| 5,323,400 A * | 6/1994 | Agarwal et al. | 714/728 |
| 5,469,445 A * | 11/1995 | Nicolaidis | 714/726 |
| 5,477,548 A | 12/1995 | Beenker et al. | 371/22.3 |
| 5,638,380 A | 6/1997 | De | 371/22.3 |
| 5,696,771 A | 12/1997 | Beausang et al. | 371/22.3 |
| 5,828,579 A | 10/1998 | Beausang | 364/488 |
| 5,903,578 A | 5/1999 | De et al. | 371/22.31 |
| 5,949,692 A | 9/1999 | Beausang et al. | 364/491 |
| 6,292,929 B2 * | 9/2001 | Scepanovic et al. | 716/14 |
| 6,378,093 B1 * | 4/2002 | Whetsel | 714/726 |
| 6,405,335 B1 * | 6/2002 | Whetsel | 714/726 |
| 6,405,355 B1 * | 6/2002 | Duggirala et al. | 716/8 |

OTHER PUBLICATIONS

Touba, Nur A., et al., "Testing Embedded Cores Using Partial Isolation Rings", pp. 10–16, *IEEE*, 1997.

Marinissen, Erik Jan, et al., "Structured and Scalable Mechanism for Test Access to Embedded Reusable Cores", 10 pages.

* cited by examiner

*Primary Examiner*—Vuthe Siek
*Assistant Examiner*—Binh Tat
(74) *Attorney, Agent, or Firm*—Sheridan Ross P.C.

(57) ABSTRACT

A method for use in the hierarchical design of integrated circuits having at least one module, each the module having functional memory elements and combinational logic, the method comprising reading in a description of the circuit; replacing the description of each functional memory element of the modules with a description of a scannable memory element configurable in scan mode and capture mode; partitioning each module into an internal partition and a peripheral partition by converting the description of selected scannable memory elements into a description of peripheral scannable memory elements which are configurable in an internal test mode, an external test mode and a normal operation mode; modifying the description of modules in the circuit description so as to arrange the memory elements into scan chains in which peripheral and internal scannable memory elements of each module are controlled by an associated module test controller when configured in internal test mode; and peripheral scannable memory elements of each module are controlled by a top-level test controller when configured in an external test mode; and verifying the correct operation of the internal test mode and the external test mode of the circuit.

75 Claims, 7 Drawing Sheets

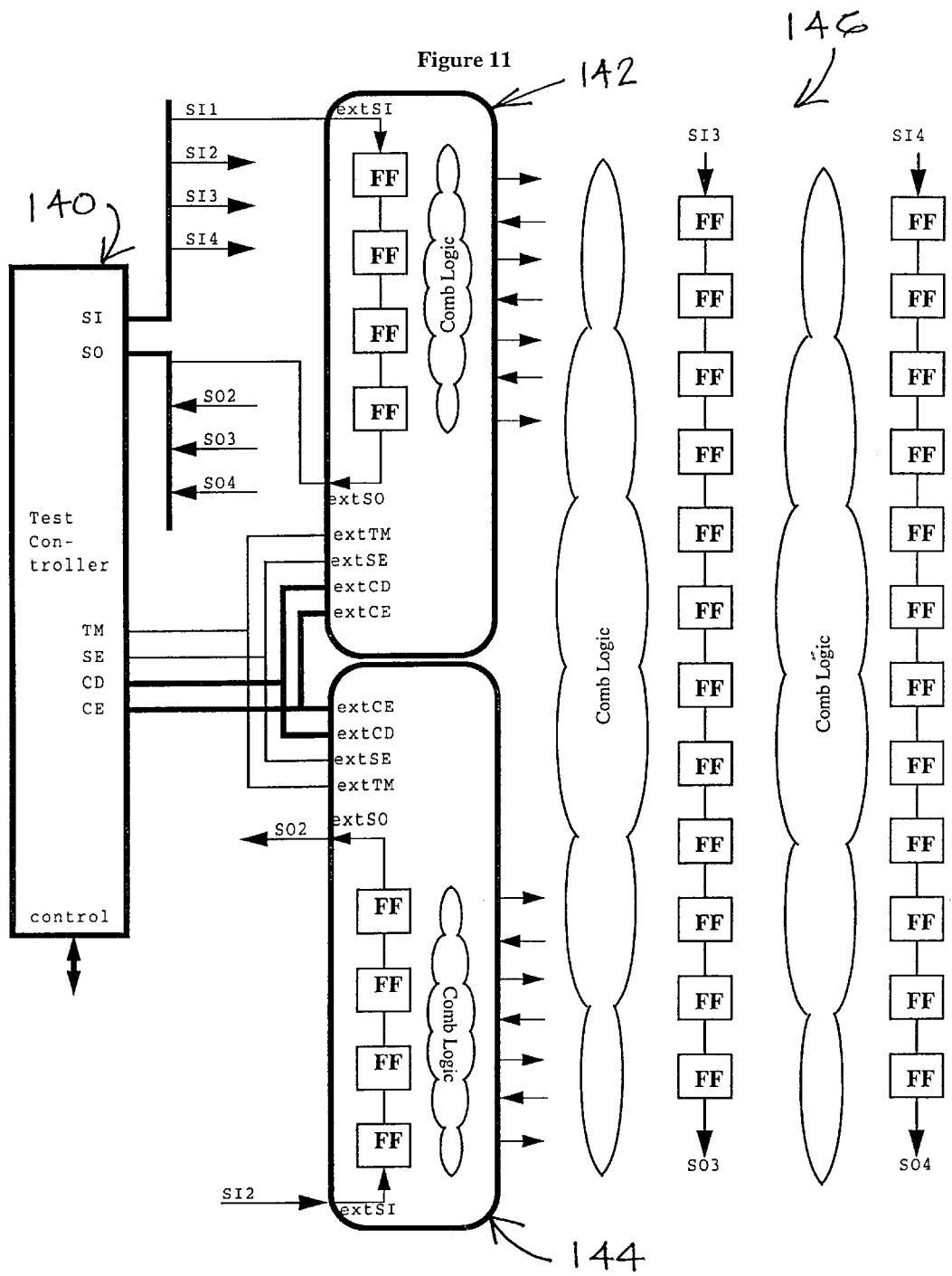

HIERARCHICAL DESIGN AND TEST METHOD AND SYSTEM, PROGRAM PRODUCT EMBODYING THE METHOD AND INTEGRATED CIRCUIT PRODUCED THEREBY

The present invention relates, in general, to the design and testing of integrated circuits, and, more specifically, to a method and system for use in the hierarchical design and testing of integrated circuits, a program product embodying the method and integrated circuits made in accordance with the method.

BACKGROUND OF THE INVENTION

The complexity of semiconductor circuits often requires partitioning the circuit design into several modules or blocks, generally referred to as design hierarchy, blocks that can verified and layed out independently from each other. This approach has been used for a long time and has several benefits, the most significant of which are to accelerate the design by allowing several designers to work in parallel and to reduce the difficulty for the design automation tools by avoiding the need to manipulate the description of the entire circuit at once. However, test automation tools do not always offer an acceptable solution for handling design hierarchy. Many test automation tools still require processing the entire circuit at once. Other test automation tools do use hierarchical test methods. However, they require complete isolation of each module such that all inputs are controllable and all outputs are observable. In a paper entitled "A structured and Scalable Mechanism for Test Access to Embedded Reusable Cores", ITC '98. paper 12.1, Marinessen et al disclose a typical example of a hierarchical method imposing this restriction. Many similar methods have been proposed recently.

All of these methods suffer from the same drawbacks. They require a large number of additional logic gates, each module pin requires test-dedicated circuitry to provide the required isolation, the test-dedicated circuitry adversely impacts system timing because the functional signals must traverse the test-dedicated circuitry, the hierarchical design does not permit communication of signals between modules to be tested "at-speed" because the test-dedicated circuitry is usually connected to low-speed clocks and accessed through a standard Test Access Port (TAP), the most popular one being the IEEE 1149.1.

SUMMARY OF THE INVENTION

The present invention addresses these drawbacks with a novel method that minimizes the use of test-dedicated circuitry by using functional memory elements to provide module isolation, eliminates the impact on system timing by manipulating the scan control signals, provides at-speed testing of logic and/or interconnection wires between modules by using the system clock connected to the functional memory elements, and facilitates at-speed testing of modules with asynchronous clocks by reducing significantly the number of gates required to implement multiple controllers. The present invention also provides a novel integrated circuit constructed in accordance with the method. The best mode of implementing the method of the present invention is to automate the method using a suitable computer system.

One aspect of the present invention is defined as a method for use in the hierarchical design of integrated circuits having at least one module, each the module having functional memory elements and combinational logic, the method comprising reading in a description of the circuit; replacing the description of each functional memory element of the modules with a description of a scannable memory element configurable in scan mode and capture mode; partitioning each module into an internal partition and a peripheral partition by converting the description of selected scannable memory elements into a description of peripheral scannable memory elements which are configurable in an internal test mode, an external test mode and a normal operation mode; modifying the description of modules in the circuit description so as to arrange the memory elements into scan chains in which peripheral and internal scannable memory elements of each module are controlled by an associated module test controller when configured in internal test mode; and peripheral scannable memory elements of each module are controlled by a top-level test controller when configured in an external test mode; and verifying the correct operation of the internal test mode and the external test mode of the circuit.

Another aspect of the present invention is defined as an integrated circuit having a plurality of modules, each the module having functional memory elements and combinational logic, the integrated circuit comprising each module being partitioned into an inner partition and a peripheral partition, the inner and peripheral partitions being delimited by peripheral memory elements, the peripheral memory elements being functional memory elements and being configurable in an internal test mode, an external test mode and a normal operating mode; each functional memory element and the peripheral memory element being configurable in shift mode for loading test stimuli thereinto and unloading test response data therefrom and in normal operating mode; the peripheral memory elements including: input peripheral memory elements one module input in the fanin of its data input; and output peripheral memory elements having at least one module output or an input peripheral memory element in the fanout of its data output; the peripheral memory elements being arranged in at least one scan chain; and control logic means associated with each the at least one scan chain responsive to control signals for configuring the peripheral memory elements in an internal test mode, an external test mode and a normal operating mode.

A further aspect of the present invention is defined as a system for use in the hierarchical design of integrated circuits having at least one module, each module having functional memory elements and combinational logic, the system comprising a general- or special-purpose digital computer; means for reading in a description of the circuit; means for replacing the description of each functional memory element of the modules with a description of a scannable memory element configurable in scan mode and capture mode; means for partitioning each module into an internal partition and a peripheral partition by converting the description of selected scannable memory elements into a description of peripheral scannable memory elements which are configurable in an internal test mode, an external test mode and a normal operation mode; means for modifying the description of modules in the circuit description so as to arrange the memory elements into scan chains in which peripheral and internal scannable memory elements of each module are controlled by an associated module test controller when configured in internal test mode and peripheral scannable memory elements of each module are controlled by a top-level test controller when configured in an external test mode; and means for verifying the correct operation of the internal test mode and the external test mode of the circuit.

A further aspect of the present invention is defined as a program product for use in the hierarchical design of integrated circuits having at least one module, each the module having functional memory elements and combinational logic, the program product comprising a computer readable storage medium, means recorded on the medium for reading in a description of the circuit; means recorded on the medium for replacing the description of each functional memory element of the modules with a description of a scannable memory element configurable in scan mode and capture mode; means recorded on the medium for partitioning each module into an internal partition and a peripheral partition by converting the description of selected scannable memory elements into a description of peripheral scannable memory elements which are configurable in an internal test mode, an external test mode and a normal operation mode; means recorded on the medium for modifying the description of modules in the circuit description so as to arrange the memory elements into scan chains in which peripheral and internal scannable memory elements of each module are controlled by an associated module test controller when configured in internal test mode; and peripheral scannable memory elements of each module are controlled by a top-level test controller when configured in an external test mode; and means recorded on the medium for verifying the correct operation of the internal test mode and the external test mode of the circuit.

BRIEF DESCRIPTION OF THE DRAWINGS

These and other features of the invention will become more apparent from the following description in which reference is made to the appended drawings in which:

FIG. 11 is a schematic of a top-level view of circuit illustrating a top-level test controller and two modules having embedded module test controllers.

DETAILED DESCRIPTION OF PREFERRED EMBODIMENTS OF THE INVENTION

As is well known in the art, integrated circuits are designed by developing a circuit description which specifies all circuit components, relationships and functionality. A circuit description is a list of statements, typically using a hardware description language (HDL), that describes modules and interconnections with other modules. Modules have one or more input ports and output ports and can be included (instantiated) within other modules, creating a hierarchy. At the lowest level of hierarchy, modules are combinational logic gates and memory elements (e.g. flip-flops). A circuit may be designed by developing combinational logic and modules which perform new functions, combine previously developed modules, and/or incorporate modules developed by several different designers. At some point during the design process, once substantially the final form of the design of an integrated circuit has been determined, it is desirable to incorporate hierarchal testing functionality into the design. Before describing the present invention, it would be useful to briefly review existing prior art by reference to FIGS. 1—3.

Figure 1:
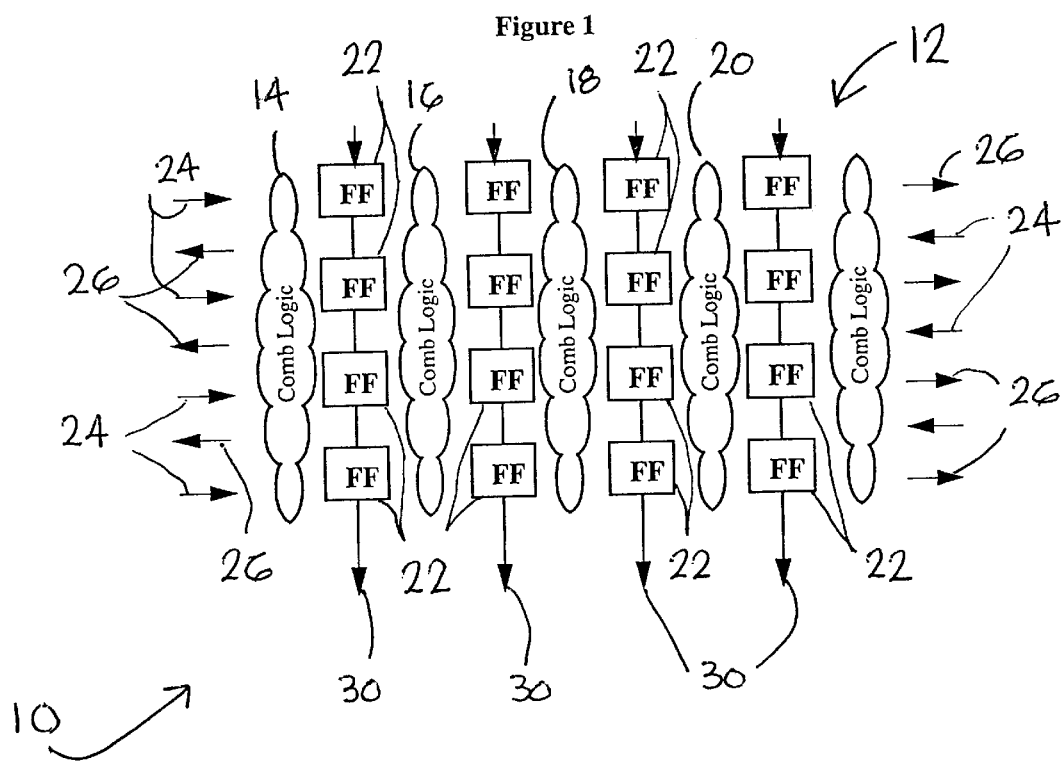
FIG. 1 is a diagrammatic view of a typical module having combinational logic and a plurality of functional memory elements arranged in a plurality scan chains.

FIG. 1 illustrates a portion of an integrated circuit 10 having a module 12 comprised of combinational logic blocks 14, 16, 18 and 20 and functional memory elements 22 which together perform a unique function or functions. The module includes one or more input pins 24 and output pins 26 connected to the functional memory elements. Memory elements 22 are arranged in four scan chains 30 in addition to performing their functional mode of operation. For simplicity, all of the memory elements are illustrated as being scannable; however, non-scannable memory elements could also be present. The modules are interconnected together to form a complete integrated circuit 10.

When it is desired or even necessary to partition the circuit for hierarchical test purposes, it is known to surround the modules by additional "test-dedicated" memory elements (not shown in FIG. 1) which operate to control module inputs and observe module outputs during hierarchical internal and external tests. The test dedicated memory elements are added to the circuit by connecting them to module input and output pins.

Figure 2:
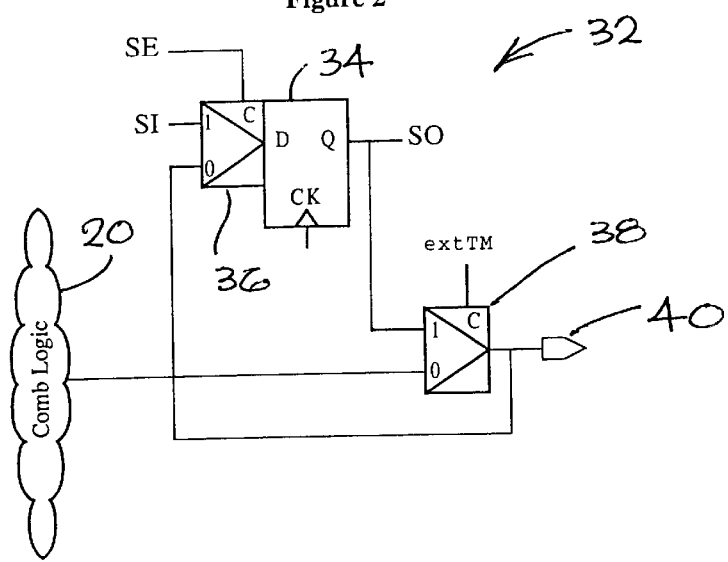
FIG. 2 is a block diagram view of a known test dedicated output peripheral flip-flop or memory element.
Figure 3:
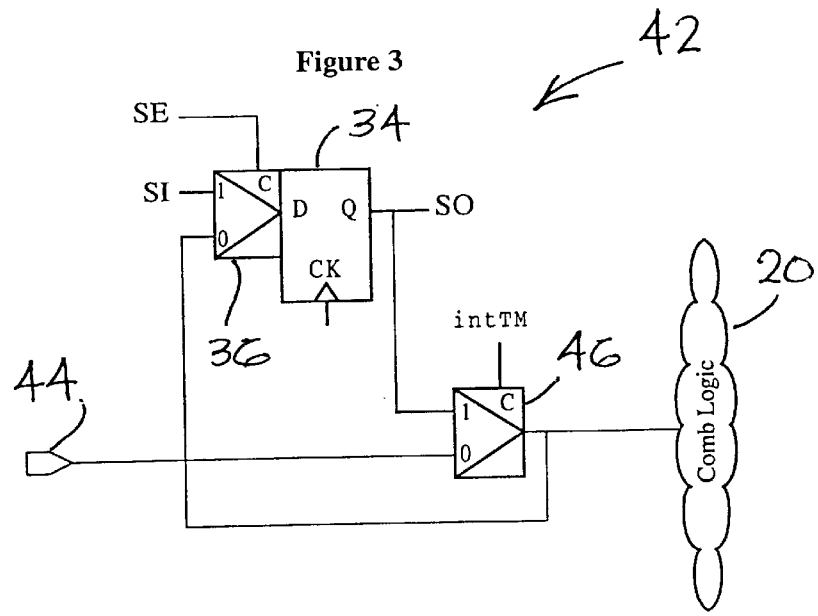
FIG. 3 is a block diagram view of a known test dedicated input peripheral flip-flop or memory element.

FIG. 2 illustrates a test-dedicated output peripheral memory element connected to a module output pin to observe the logic inside the module during an internal test. FIG. 3 illustrates a test-dedicated input peripheral memory element connected to a module input pin for controlling and observing data applied to the module during an internal test. The test dedicated peripheral memory elements are also connected in scan chains which are used both during the test of the module itself and the test of the gates and interconnections between modules. The peripheral memory element scan chains are different from the functional memory element scan chains shown in FIG. 1 which are used only during the test of the module itself. Typically, the peripheral test-dedicated memory elements all use the same clock which is different from the functional clocks used in the modules.

Referring to FIG. 2, an output test-dedicated peripheral memory element 32 includes a flip-flop 34 having a data input D, an output Q and a clock input, CK, and an input multiplexer 36 having a test stimulus input SI, a data input and a scan enable control input which receives a Scan Enable signal SE. Output Q is connected to the high input of a module multiplexer 38. The low input of the module multiplexer receives an output of the combinational logic 20. The output of the module multiplexer is connected to a module output pin 40. The module multiplexer control input receives an external test mode control signal, extTM. During external test mode, extTM is active and therefore the output of the flip-flop is connected to module output pin 40. This allows the output of the module to be controlled when the memory elements are configured in capture mode. During internal test mode, extTM is inactive and therefore the output of the combinational logic is connected to the module output pin 40. This allows the output of the module to be observed when the memory elements are configured in capture mode.

During normal operation of the circuit, the scan enable signal and the external test mode control signal are low (logic 0). Thus, the flip-flop and its input multiplexer are not functional and the output of the combinational logic passes through to the module output 40. In external test mode, the external test mode control signal, ExtTM, is active (logic 1) which causes the output of the module to be controlled and observed, as already mentioned, and to be passed through to the module output pin. In scan or shift mode, when the scan enable signal, SE, is active, the peripheral memory elements are connected in series and a test stimulus is shifted into the flip-flops and output at the Q/SO and applied to the module output multiplexer 38. In capture mode, when the scan enable signal is inactive, the output of the combinational logic 20 is applied to the low input of the flip-flop input multiplexer 36 and to the flip-flop where its value is captured.

The construction and principle of operation is essentially the same for the input peripheral memory element 42 in FIG. 3 in which the same reference numerals used in FIG. 2 have been used in FIG. 3 to designate like parts. In this case, a module input pin 44 is connected to the low input of a module input multiplexer 46 which is controlled by a internal test mode control signal, IntTM.

During normal operation of the circuit, the scan enable signal and the external test mode control signal are low (logic 0). Thus, the flip-flop and its input multiplexer are not functional. The input at the input pin 44 passes through to the input multiplexer 46 and applied to the combinational logic 20. In internal test mode, the internal test mode control signal, IntTM, is active (logic 1) which causes the input of the module input pin to be controlled from the flip-flop output. In scan or shift mode, when the scan enable signal, SE, is active, the peripheral memory elements are connected in series and a test stimulus is shifted into the flip-flops and output at Q/SO and applied to the module input multiplexer 46. In capture mode, when the scan enable signal is inactive, the input of the input pin is applied to the low input of the flip-flop input multiplexer 36 and to the flip-flop where its value is captured.

It will be appreciated by those skilled in the art that the "test-dedicated" memory elements add to the circuit a significant number of gates that are never used during normal operation of the circuit. Specifically, the flip-flop and its associated input multiplexer are not used during normal operation of the circuit. Typical modules have hundreds or thousands of inputs and outputs. Also, the module input and output multiplexers reside on the functional path between the module logic and the input and output pins, respectively, and adversely affect the performance of the circuit because of the delay introduced by these multiplexers. Finally, since the clock applied to test-dedicated memory elements is different from the functional clock used to generate or receive the signals going in and out of the module, it is not possible to perform "at-speed" tests of the paths between the module inputs and outputs and the functional memory elements. However, even if the functional clocks were applied to the test dedicated memory elements, the paths which would be tested would not be functional paths.

The primary benefits of providing test-dedicated memory elements at the boundary of the modules is that they allow the internal circuitry of the module to be "hidden" from the top-level of the circuit and the application a pre-existing set of test patterns to internal circuitry. While these benefits might be important in the context of third party Intellectual Property modules, such perfect isolation of the entire module is not required in a large majority of cases. That is, it is perfectly acceptable to isolate part of a module and to apply an internal test to the isolated or partitioned part of the module and test the remainder of the module during a second test phase which verifies the gates and interconnects between modules. This second test is referred to an "external test" later in this description. The present invention proposes eliminating the test-dedicated memory elements and using existing functional memory elements in the modules to define a boundary between a test or internal partition and a peripheral partition. This boundary may not necessarily match the actual or physical boundary of the module as explained below.

Integrated Circuit according to the Present Invention

An integrated circuit constructed in accordance with the present invention differs from known integrated circuits described above because of the elimination of the need for a substantial number of test-dedicated peripheral memory elements by employing functional memory elements to provide the function of the test-dedicated memory elements. Thus, in an integrated circuit according to the present invention, each module is partitioned into an inner partition and a peripheral partition, with the inner and peripheral partitions being delimited by peripheral memory elements which are functional memory elements configurable in an internal test mode and in an external test mode, in addition to their normal mode of operation. Each functional memory element and peripheral memory element is configurable in shift mode for loading test stimuli thereinto and unloading test response data therefrom and in normal operating mode. The peripheral memory elements include input peripheral memory elements which are functional memory elements having one module input in the fanin of its data input; and output peripheral memory elements which are functional memory elements having at least one module output or an input peripheral memory element in the fanout of its data output. The peripheral memory elements are arranged in at least one scan chain. Control logic is associated with each scan chain and responsive to control signals for configuring the peripheral memory elements in an internal test mode, an external test mode and a normal operating mode.

During normal mode of operation, memory elements are configured in capture mode. During internal test mode, output peripheral memory elements can be configured in capture, shift and hold modes and input peripheral memory elements can be configured in shift and hold modes. During external test modes, input peripheral memory elements can be configured in capture, shift and hold modes and output peripheral memory elements can be configured in shift and hold modes.

FIGS. 5–8 illustrate different types of input and output peripheral memory elements according to the present invention. In general, each peripheral memory element includes a functional memory device, such as a flip-flop. The flip-flop mentioned in the following description of these figures are the functional memory elements of the modules prior to modification of the circuit by use of the method of the present invention.

Figure 5:
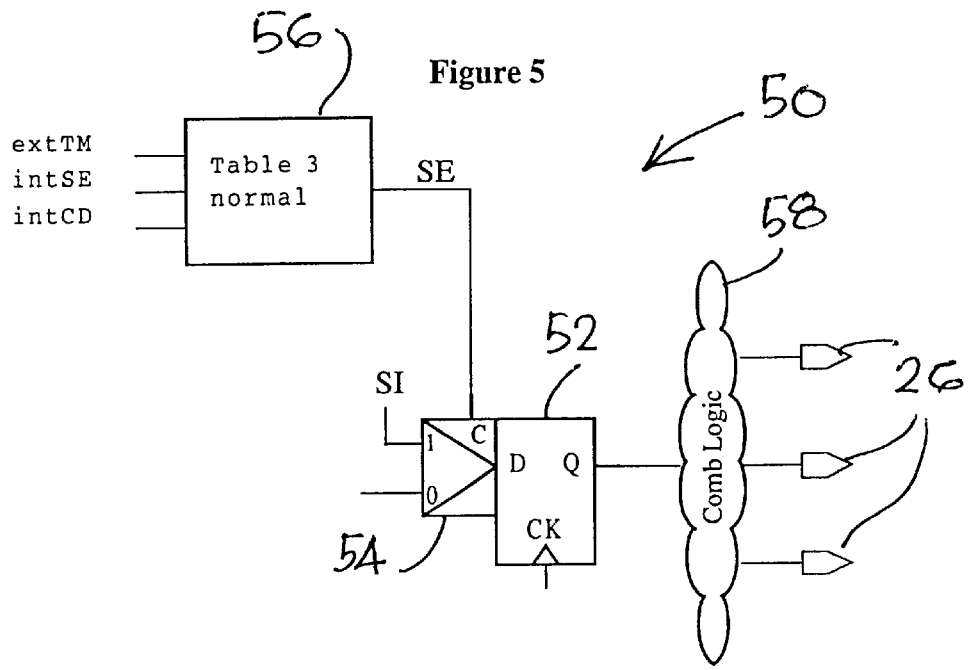
FIG. 5 is a schematic of a "normal style" output peripheral memory element according to an embodiment of the present invention.
Figure 7:
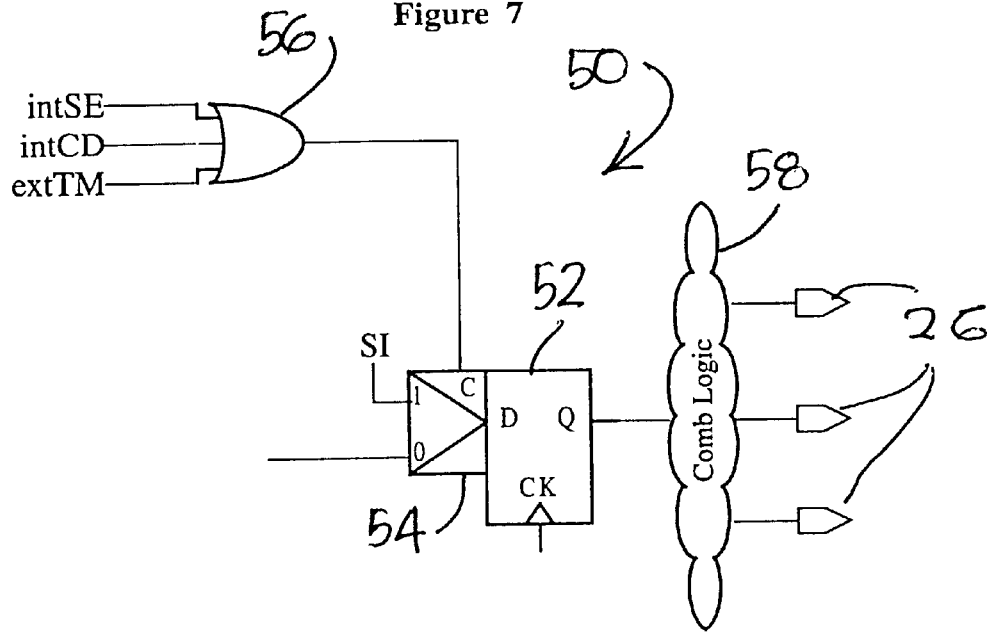
FIG. 7 is a schematic illustrating one embodiment of a control logic circuit according to one embodiment the present invention for use with an output peripheral memory element.

FIG. 5 is a schematic of an Normal style output peripheral memory element 50. The definition of Normal style is given later. The memory element includes a flip-flop 52 having an input D, a clock input CK and an output Q. An input multiplexer 54 has high input for receiving a test stimulus scan input SI and the low input is for an internal signal of the module. The multiplexer control input receives a scan enable output SE of a control logic circuit 56, described later. The output of the input multiplexer is connected to the D input of the flip-flop. The Q output of the flip-flop is connected to an output pin of the module or an input peripheral memory element, which may be through combinational logic 58. FIG. 7 is similar to FIG. 5 but illustrates the control logic as being an OR gate which receives three input control signals.

Figure 6:
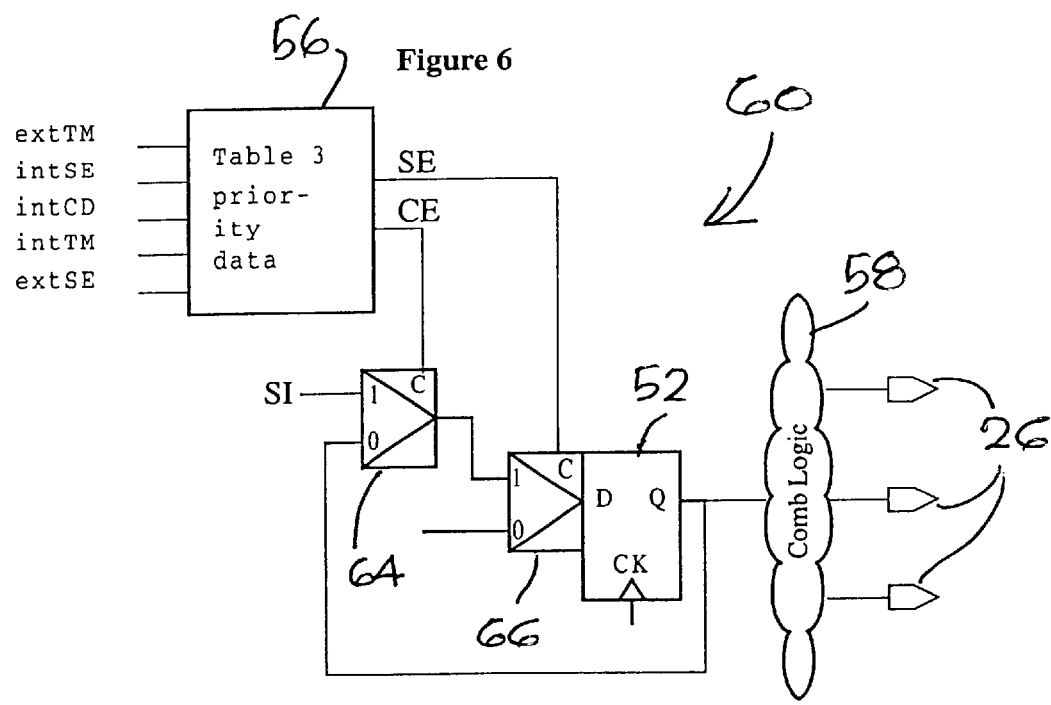
FIG. 6 is a schematic of a "priority data style" output peripheral memory element according to an embodiment to the present invention.

FIG. 6 is a schematic of an Priority Data style output peripheral memory element 60. The primary purpose of a Priority Data style memory element is to allow the memory element to be configured in Hold mode. The memory element includes a flip-flop 52 having an input D, a clock input CK and an output Q. A first input multiplexer 64 has high input for a test stimulus scan input SI and the low input which receives the output Q of the flip-flop which is an internal signal of the module. The first multiplexer control input receives a clock enable output CE of control logic circuit 56, described later. The output of the first input multiplexer is connected to the high input of a second input multiplexer 66 whose low input is an internal signal of the module and the output of which is applied to the D input of the flip-flop. The Q output of the flip-flop is connected to an output pin of the module, which may be through combinational logic 58. The memory element is configured in scan mode when both SE and CE are active, in capture mode when SE is inactive and CE is active and in a Hold mode when both SE and CE are inactive.

Figure 8:
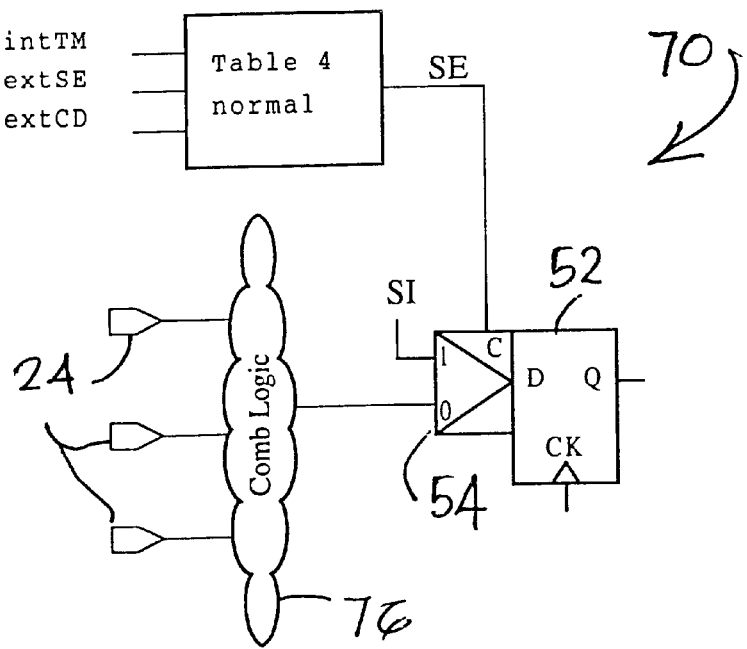
FIG. 8 is a schematic illustrating one embodiment of control logic according to the present invention for use with an input peripheral memory element.
Figure 9:
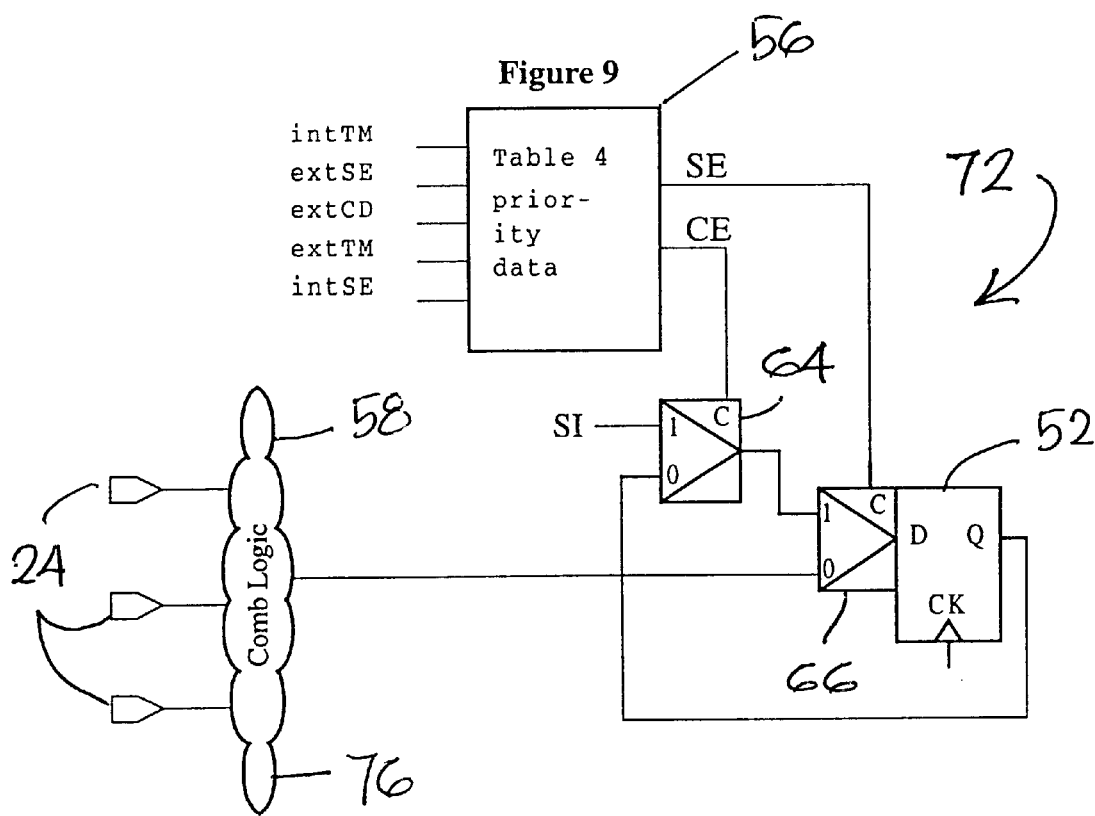
FIG. 9 is a schematic illustrating one embodiment of control logic according to the present invention for use with a "priority data style" input peripheral memory element.

FIGS. 8 and 9 are similar to FIGS. 5 and 6, respectively, except that they illustrate Normal style and Priority Data style input peripheral memory elements 70 and 72, respectively. Thus, instead of receiving an internal module signal, these elements receive an input from circuitry which is external to the module, which may be through combinational logic inside the module and provide an input to internal logic, and provide an output to one or more module input pins 24, which may be through combinational logic 76.

The peripheral memory elements are "scannable" which means that the memory elements are configurable in a shift mode and a capture mode. The peripheral memory elements are also configurable in external test mode and internal test mode by the control logic means which generates mode control signals . In both cases, functional signals are not required to pass through test dedicated memory elements which are not involved in the normal operation of the module.

New Hierarchical Design Method

In practice, integrated circuits are designed by developing a circuit description of each of the modules and of other components and interconnections in the circuit. The method of the present invention is carried out after the design of an integrated circuit is substantially complete when the design of the integrated circuit is still in the form of a Hardware Description Language (HDL) description. Sample Circuit Description A illustrates a very simple example of such a description. For simplicity, this very simple sample description defines only one module. It will be understood by those skilled in the art that such descriptions may occupy many thousands of pages. The actual content of the circuit description is not important, except to note that it will contain descriptions of functional memory elements, such as flip-flops.

The module contains eleven flip-flops which are neither scannable, i.e. configurable in shift and capture modes, nor configurable in internal or external test mode. The circuit does not contain any test-dedicated memory elements. For convenience of the reader, the circuit includes remarks which begin with double slashes "//" which identify flip-flops which need to be converted to input (flip-flops: flop1–4)and output (flip-flops: flop9–11) peripheral memory elements as well as flip-flops (flip-flops: flop6–8) which are not to be converted to peripheral memory elements, but which need to be made scannable. The following description explains a method according to the present invention of making these modifications.

The method of the present invention generally comprises
  reading in a description of the circuit;
  replacing the description of each functional memory element of the modules with a description of a scannable memory element configurable in scan mode and capture mode;
  partitioning each module into an internal partition and a peripheral partition by converting the description of selected scannable memory elements into a description of peripheral scannable memory elements which are configurable in an internal test mode, an external test mode and a normal operation mode;
  modifying the description of modules in the circuit description so as to arrange the memory elements into scan chains in which:
    peripheral and internal scannable memory elements of each module are controlled by an associated module test controller when configured in internal test mode; and
    peripheral scannable memory elements of each module are controlled by a top-level test controller when configured in an external test mode; and
  verifying the correct operation of the internal test mode and the external test mode of the circuit.

The best mode of implementing method of the present invention is as a program product stored on a computer readable medium and loaded in a suitable general- or special-purpose digital computer.

Sample Circuit Description B illustrates a description which resulted from the modification of Sample Circuit description A according the above described method. A comparison of the respective descriptions of Flop1–Flop11 in the two sample circuit descriptions will show that each has been supplemented with a description necessary to render the flip-flops scannable and configurable in internal and external test modes and arranged in scan chains. By way of example, consider Flop1 which was to be converted to an input peripheral memory element because it satisfies the definition thereof, which is given later. The original description of Flop1 was:

DTN12 flop1 (.CLK(CLKA), .D(D[0]), Q(Q[0]));

The revised description is:

TDN20_PD flop1
(.CLK(CLKA),

.D(D[0]),
.SD(LV_SI0_CK1_F1_ext),
.QZ(LV_SO0_CK1_F1_ext_0),
.SCAN(LV_testmode_or_LV_SE_CK1_ext_or_LV_CD2_ext),
.CE(LV_testmode_or_or_LV_SE_CK1_ext));

This flip-flop has been converted to a Priority Data style memory element which is scannable, configurable in internal and external test modes and arranged in a scan chain. It will be understood by those skilled in the art that tools for searching through circuit descriptions and modifying descriptions are well known in the art and, therefore, need not be described in detail herein and do not in themselves part of the invention.

In order to choose the memory elements that should be used to establish the boundary of the partition, it is important to understand the concept of peripheral memory elements according to the present invention. According to the present invention, "peripheral flip-flops or memory elements" are functional memory elements which are connected, either directly or through combinational logic, to primary inputs and outputs of a module. The definition of input and output peripheral flip-flops or memory elements is given below and several examples are illustrated in FIG. 4:

An "input periphery flip-flop or memory element" is a flip-flop or memory element which has one or more module inputs in its fanin.

An "output periphery flip-flop or memory element" is a flip-flop or memory element which does not have any module inputs in its fanin and has one or more module outputs and/or input periphery flip-flops in its fanout.

Figure 4:
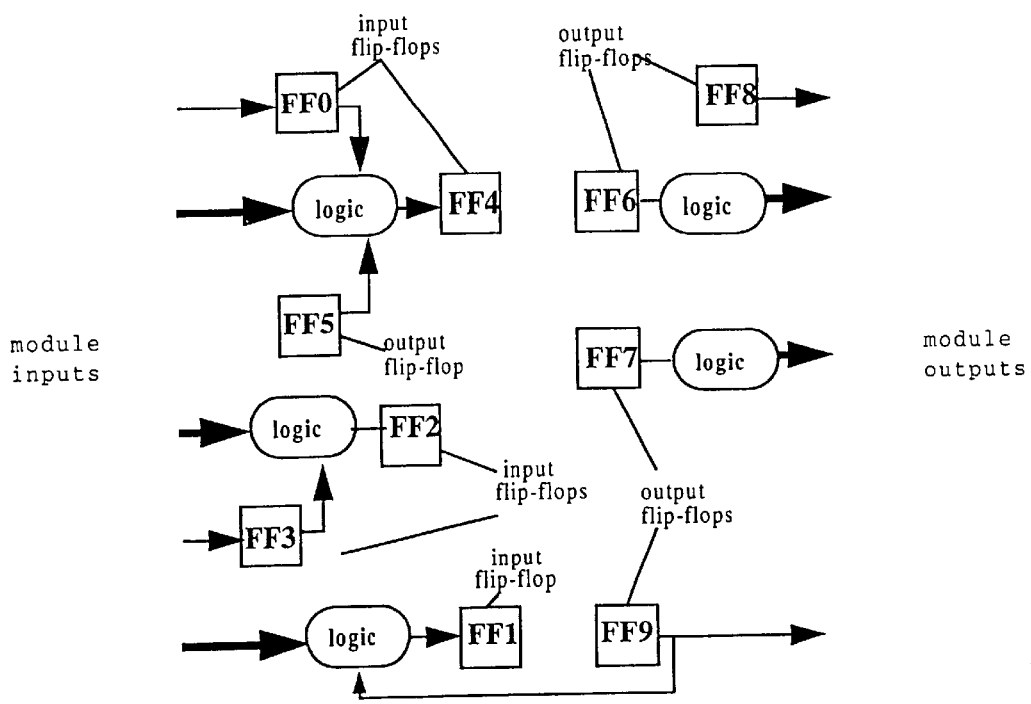
FIG. 4 is a block diagram view of a module with functional memory elements for use in illustrating a method of selecting functional memory elements for use as peripheral memory elements according to one embodiment of the present invention.

FIG. 4 diagrammatically illustrates part of the circuitry of a module. Memory elements FF0 to FF4 are input peripheral elements because each has one or more module inputs in its fanin. Memory elements FF6 to FF9 are output peripheral flips-flops because none has any module inputs in its fanin and each has one or more module outputs in its fanout. Memory element FF5 is a special case which does not have any module inputs and outputs in its fanin or fanout and yet is considered to be a peripheral memory element; specifically, an output peripheral element. This is because its output is required to test the part of the combinational logic whose output is observed by the input peripheral memory element FF4 and this part of the circuit is only tested during an external test.

Peripheral memory elements are needed during both the internal and the external test modes. They are controlled differently in the two modes. During an internal test, an observe the logic inside the test partition defined by the peripheral memory elements and input peripheral memory elements must not be configured in a capture mode to prevent the outcome of the internal test from being influenced by the logic outside of the test partition. Conversely, during an external test, output peripheral memory elements must not be configured in capture mode to prevent the outcome of the external test from being influenced by the logic inside the test partition and input peripheral memory elements must be configurable in capture mode in order to observe the logic outside the test partition defined by the peripheral memory elements. This is achieved by applying an external test mode control signal, extTM, to output peripheral memory elements and an internal test mode control signal, IntTM, to input peripheral memory elements. When these signal are active, the memory elements to which they are applied are maintained in shift or Hold mode so that they are unable to be configured in capture mode and perform a capture operation.

As discussed below, memory elements are categorized into different Types depending on the nature of input and output signals. The method of the present invention investigates the nature of the signals applied to and transmitted by the memory elements and specifies the appropriate type.

Peripheral Memory Element Types

Peripheral memory elements are classified into different types in order to facilitate the determination of the circuitry required for individual memory elements and for the control logic applied to them.

Tm Type

All peripheral memory elements must be configurable in a capture mode during their normal mode of operation. A peripheral memory element (input or output) whose capture mode is completely disabled during an internal test or an external test is referred to as a "Tm" memory element. Input peripheral memory elements must be configurable in a capture mode to observe the logic outside the internal test partition defined by the peripheral memory elements. Similarly, output peripheral memory elements must be configurable in a capture mode to observe the logic inside the internal test partition defined by the peripheral memory elements. Test-dedicated memory elements do not have any specific requirement during this capture mode.

Tx and Rx Types

The control of the peripheral memory elements must accommodate timing considerations when more than one clock domain is present in the circuit. Co-pending U.S. patent application Ser. No. 09/209,790 filed on Dec. 11, 1998 for "Clock Skew Management Method and Apparatus", which is incorporated herein by reference, describes the concept of Transmit (Tx) and Receive (Rx) memory elements to address the issues arising from clock skew between clock domains when the memory elements of the different domains interact with one another. A Tx memory element is the source of a signal which crosses a clock domain boundary. An Rx memory element is the destination or recipient of a signal transmitted across a clock domain boundary. The basic concept of the clock skew management invention is that two memory elements in different clock domains and connected to each other through combinational logic must not be configured in a capture mode at the same time. Thus, Capture Disable signals, CD, are generated to suppress the capture mode of the memory elements at the appropriate time. The suppression of the capture mode is implemented differently for Rx and Tx flip-flops.

A memory element of type Tx must be configurable in a Hold mode in additional to the shift mode and capture mode required for scan testing. In Hold mode, the memory element holds its output constant for a predetermined number of clock cycles. The aforementioned application describes several ways of implementing a Hold mode. The present application focuses on the "Priority Data" style of memory element illustrated in FIGS. 6 and 8.

Nm Type A peripheral memory elements which are not of the Tm, Rx or Tx types are called "Normal Scan", Nm, memory elements as their behaviour is affected only by a Scan Enable, SE signal which is well known in the art. This signal configures the memory element in a shift mode when active and a capture mode when inactive.

Some memory elements may have combined behaviours. For example, a memory element can be both an Rx and Tx memory element at the same time for a given test. This case is identified as Rx/Tx or Tx/Rx (the order is not important). The other case of interest is when a memory element of type Tm (capture mode always suppressed) is also of type Tx (i.e. a source of a cross-domain timing path).

Table 2 lists all possible memory element types that can be associated with input and output peripheral memory elements according to internal and external test modes. The table indicates that input peripheral memory elements can be either of type Tm or Tm/Tx during an internal test and, since their capture mode is suppressed continuously during this mode, they cannot be of type Rx or Nm. However, during an external test, these memory elements can be of type Rx, Nm, Tx or Tx/Rx. Table 2 is symmetric, i.e., the types associated with output peripheral memory elements are the same as input peripheral memory elements except that they apply in the opposite test mode. Note finally that peripheral memory element of the type Tx (including combinations such as Tm/Tx, Rx/Tx), must employ a priority-data style of memory element.

TABLE 2

Peripheral Memory Element Types During Internal and External Test

| Periphery flip-flop | Internal Test | External Test |
|---|---|---|
| Input | Tm, Tm/Tx | Nm, Rx, Tx, Tx/Rx |
| Output | Nm, Rx, Tx, Tx/Rx | Tm, Tm/Tx |

Nm = Normal Scan, Tx = Transmit, Rx = Receive, Tm = Test Mode

Output Peripheral Memory Elements

FIGS. 5 and 6, described earlier, show the manner in which control logic is connected to output peripheral memory elements. FIG. 5 illustrates a Normal style scannable output peripheral memory element and associated control logic and FIG. 6 illustrates a Priority-Data style memory element. These memory elements are connected directly to exterior circuitry, such as combinational logic, and do not include the output multiplexer of standard test-dedicated memory elements. The control logic generates a scan enable signal, SE and, in some cases, a Clock Enable signal, CE, from input signals provided by a module test controller and/or a Top-Level test controller, both described later, and applied to appropriate inputs of the memory element.

"Normal" style output memory elements do not require a Hold mode. There are three possible inputs to the control logic: extTM (external Test Mode), intSE (Scan Enable for internal test) and intCD (Capture Disable for internal test). The intCD signal is required only if the memory element is of type Rx during an internal test.

During an external test, extTM is active. (logic 1) and, thus, the output peripheral memory elements are maintained in shift mode and cannot be configured in capture mode. During an internal test, extTM is inactive (logic 0). intSE is active when a test stimulus is loaded into peripheral memory elements and when response data is unloaded and is inactive during the capture mode. intCD is activated when the capture mode of an output peripheral memory element is to be suppressed.

The control logic for Priority-Data style of peripheral memory elements is more complex than that of Normal style peripheral memory elements. The control logic accepts up to five inputs and provides two outputs. The first three inputs are the same as those of Normal style memory elements, namely, extTM, intSE and intCD. The two additional inputs are intTM (internal Test Mode) and extSE (Scan Enable for external test). The outputs are SE and CE, as already mentioned.

The input signals are combined according to the rules delineated in Table 3 to provide the appropriate SE and CE signals. The vertical bar (|) between input signals represents a logical OR operation. FIG. 7 illustrates the control logic circuit resulting from the rule SE=intSE|intCD|extTM (third line of Table 3) for a Normal style memory element. As can be seen, the control logic is simply comprised of an OR gate which receives the three input signals and produces the one output signal, SE. For Priority-Data style memory elements, a second OR gate is provided to generate the Clock Enable signal, CE.

TABLE 3

Control Logic for Output Peripheral Flip-Flops

| Scan Flip-Flop style | During Internal Test | During External Test | Control Logic |
|---|---|---|---|
| Normal | Nm | Tm | SE = intSE \| extTM |
| Priority Data | Nm | Tm/Tx | SE = intSE \| extTM |
|  |  |  | CE = intTM \| extSE |
| Normal | Rx | Tm | SE = intSE \| intCD \| extTM |
| Priority Data | Rx | Tm/Tx | SE = intSE \| intCD \| extTM |
|  |  |  | CE = intTM \| extSE |
| Priority Data | Tx | Tm | SE = intSE \| intCD \| extTM |
|  | Tx/Rx |  | CE = intSE \| extTM |
| Priority Data | Tx | Tm/Tx | SE = intSE \| intCD \| extTM |
|  | Tx/Rx |  | CE = intSE \| extSE |

Input Peripheral Memory Elements

Input peripheral flip-flops are controlled in a manner similar to that of output peripheral memory elements, as shown in FIGS. 8 and 9. The control logic for input peripheral memory elements is generated according to rules outlined in Table 4. The possible input signals to the control logic of Normal style memory elements are: intTM to identify internal Test Mode when active, extSE to specify, when active, Scan Enable for an external test, and extCD to specify Capture Disable for external test when active. For priority data style memory elements, the additional input signals are intSE to specify, when active, Scan Enable during an internal test and extTM, to specify when active that an external test is in effect.

TABLE 4

Control Logic for Input Peripheral Flip-Flops

| Scan Flip-Flop style | During Internal Test | During External Test | Control Logic |
|---|---|---|---|
| Normal | Tm | Nm | SE = intTM \| extSE |
| Normal | Tm | Rx | SE = intTM \| extSE \| extCD |
|  |  | Tx | SE = intTM \| extSE \| extCD |
| Priority Data | Tm | Tx/Rx | CE = intTM \| extSE |
| Priority Data | Tm/Tx | Nm | SE = intTM \| extSE |
|  |  |  | CE = intSE \| extTM |
| Priority Data | Tm/Tx | Rx | SE = intTM \| extSE \| extCD |
|  |  |  | CE = intSE \| extTM |
| Priority Data | Tm/Tx | Tx | SE = intTM \| extSE \| extCD |
|  |  | Tx/Rx | CE = intSE \| extSE |

Multi-Cycle Paths

Peripheral memory elements which are the source of multi-cycle paths, i.e., signals which require more than one clock cycle to travel from the output of a memory element to its destination, require a slightly different implementation from those described above. Applicant's U.S. patent application Ser. No. 09/192,839 filed Nov. 20, 1996 for "Method and Apparatus for Testing Digital Circuits", which is incorporated herein by reference, describes methods for handling this situation. These memory elements require the Priority Data style of memory elements and the control logic generating the clock enable, CE, output will always depend on specific clock enable signals generated for the internal, intCE, and external, extCE, test modes. The rule for generating the CE output of the control logic is always:

$$CE = intCE \text{ \& } extCE$$

The & symbol between input signals represents a logical AND operation. It is possible for a peripheral memory elements to be source of a multi-cycle paths in one test mode and the source of single-cycle path only in another test mode. An example of this is if an input peripheral memory element is specified as a source of multi-cycle paths and it fans out only to internal logic. In this case, the intCE signal would be controlled to implement the appropriate effective frequency as described in aforementioned application Ser. No. 09/192,839 and the extCE signal would be active throughout the entire external test mode.

The control logic can be shared among memory elements used in a similar context, thereby reducing the overall number of logical gates required to implement the test circuitry.

Test-Dedicated Memory Elements

It is not always possible to completely eliminate the use of test-dedicated peripheral flip-flops. Some control input signals can propagate to a large number of flip-flops in the modules. All these flip-flops would become part of the peripheral scan chain and most of the logic of the module would be tested during the external test, which is contrary to an objective of the present invention of testing a maximum amount of the logic of the module during the internal test and leave a minimum amount of the logic to be tested during the external test. Typical examples of control input signals which affect a large number of flip-flops are "reset" and "mode" inputs. Test-dedicated memory elements must be used to block these paths from the control inputs to module flip-flops during the internal test. Since these inputs are usually low-speed inputs, it is not as important to test the timing between the necessary test-dedicated flip-flops and the module internal memory elements.

According to the method of the present invention, the step of partitioning the modules further includes adding to the circuit description, a description of test-dedicated memory elements connected to module inputs comprising counting the number of gates and memory elements in the fanout of module inputs and in the fanin cone of module outputs; and adding to the circuit description a description of a test-dedicated peripheral memory element connected to each module input in which the number of gates in the fanout of the module input exceeds a predetermined number and adding to the circuit description a description of a test-dedicated peripheral memory element to a module output in which the number of gates in the fanin to said module output exceeds a predetermined number.

The identification of inputs and outputs that require test-dedicated memory elements for isolation is done by counting the number of gates and flip-flops in the fanout of module inputs and in the fanin cone of module outputs. Module inputs with excessive fanout or module outputs with excessive fanin are prime candidates for test-dedicated flip-flops. There is no single number of gates and/or flip-flops that determines whether or not a module input or output should use a test-dedicated flip-flop. The overall objective is to ensure that a large majority of the module gates and flip-flops be tested during the internal test without compromising circuit performance and while minimizing the number of test-dedicated gates and flip-flops. Automation software is necessary to perform this task, especially the counting of the gates. Two levels of information are needed by the user to perform an appropriate trade-off.

First, global ratios giving the percentages of peripheral logic and peripheral flip-flops over the total number of module gates and flip-flops provide immediate feedback about the quality of the isolation of the module. The "peripheral logic" refers to the gates between the peripheral memory elements and the module inputs and outputs. If these percentages are small enough to achieve the objective of maximizing the amount of logic tested during the internal test, there is no further action required. The following is an example of a report providing the global ratios:

Peripheral logic summary:
  Number of module pins with test-dedicated flip-flops: TDFF
  Ratio of peripheral logic to circuit gates: X/Y: Z %
  Ratio of peripheral flip-flops to total flip-flops: PFF+TDFF/TFF+TDFF: ZZ %

The number of module pins with test-dedicated flip-flops is 0 by default.

Second, if the ratios above are not satisfactory, then a second level of information is necessary to choose which module inputs and outputs should have test-dedicated memory elements to achieve the objective. The number of peripheral gates and flip-flops associated with each module input and output is determined and reported in a list such as is shown in Table 5. The list is sorted to facilitate the identification of problem areas. For example, the list can be sorted by decreasing number of peripheral gates which shows the best candidates for test-dedicated memory elements at the top of the list.

Table 5 lists all module pins, the total number of associated peripheral logic gates and peripheral flip-flops and the clock domain of the associated flip-flops. If the pin is selected to use a test-dedicated flip-flop, the clock input of the test-dedicated memory element should be connected to this clock to minimize clock skew between the pin and its associated flip-flops. It can be seen that pin IN2 is clearly the best candidate for a test-dedicated memory element. It can remove up to 3400 gates and 30 flip-flops from the peripheral logic. The user can then add a flag in the circuit description, TDFF example below, indicating that a test-dedicated flip-flop should be added to this pin. The format of the file is such that it can be read back by an analysis software tool that will calculate the new ratios of peripheral logic.

TABLE 5

Periphery Detail Information

| pin name | # gates | # flip-flops | Clock domain name | flag |
|---|---|---|---|---|
| IN2 | 3400 | 30 | CLKA | TDFF |
| BBB | 40 | 4 | CLKA | |
| OUT4 | 10 | 2 | CLKB | |
| ... | ... | ... | ... | |
| IOP | 4 | 1 | CLKA | |

The process might need to be re-iterated a few times because several gates and flip-flops might be associated with more than one pin. Therefore, it may be necessary to specify a combination of input/output pins to remove these gates and flip-flops. Software automation may be needed in complex cases to perform this iteration as many times as is required to meet this objective.

Once the peripheral flip-flops have been identified and selected, the appropriate control logic determined and a description thereof inserted into the circuit description, the peripheral memory elements are grouped into scan chains that are separate from the internal scan chains of the modules and the circuit description is modified to define the peripheral memory element scan chains. Test-dedicated memory elements are also made part of these scan chain.

Figure 10:
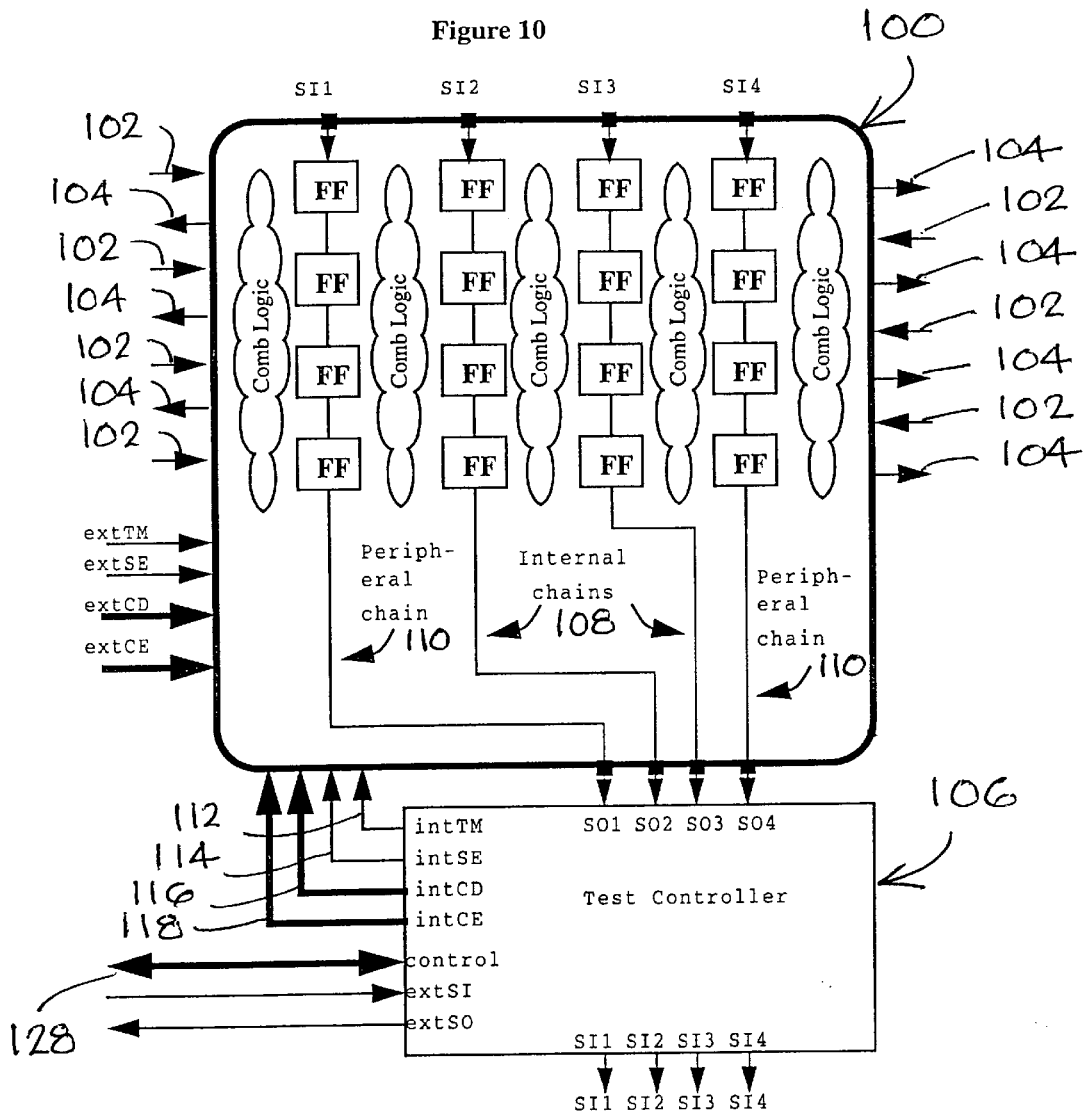
FIG. 10 is a schematic of a module and an embedded test controller according to one embodiment of the present invention.

FIG. 10 diagrammatically illustrates a module 100 having module inputs 102 and module outputs 104 and a module test controller 106 which generates required signals as will now be explained. The module includes internal scan chains 108 and peripheral memory element scan chains 110. Scan chains 108 and 110 are connected to test controller 106 associated with module 100. The module test controller generates the intTM, intSE, intCE and intCD signals required for internal tests and applies these signals to the previously mentioned control logic circuits associated with the peripheral memory element scan chains along buses 112, 114, 116, and 118. Signals required for external tests, namely, extTM, extSE, extCE and extCD are generated by an external source, described later with reference with FIG. 11, and applied to module external test control signal inputs 120, 122, 124 and 126. Module test controller 106 is provided with extSI pin for receiving a test stimulus and an extSO pin for outputting test response data during the external test mode. These pins are connected to the top-level test controller. The memory elements connected between the extSI and extSO pins are all the peripheral memory elements and the memory elements of the test controller. A plurality of extSI and extSO pins can be defined, if desired, to reduce test time. The module test controller is connected to a control bus 128 is used to provide the module test controller with the information, well known in the art, required to set up the internal test and for the test controller to return test results via the same bus. Test data enters the scan chains at module pins SI1, SI2, SI3 and SI4 and response data is leaves the scan chains and enters the test controller at test controller pins SO1, SO2, SO3 and SO4. Response data is shift out of the test controller to a top-level controller at test controller pins SI1, SI2, SI3 and SI4.

Once all modules have been arranged in the manner illustrated in FIG. 10, the modules are connected to the aforementioned external source, namely, a top-level test controller 140, shown in FIG. 11, which is responsible for the external tests. FIG. 11 diagrammatically illustrates the top level test controller, two module blocks 142 and 144, each of which includes a module and module test controller shown in FIG. 10 and other circuitry generally designated by reference numeral 146.

The top-level test controller, is similar to the module test controllers associated with the various modules. The top-level test controller has SI outputs and SO inputs connected respectively to the extSI ports (Serial Inputs for external test) and extSO ports (Serial Outputs for external test) of the modules with embedded controllers and to SI and SO ports of other scan chains that are not part of any modules with embedded test controllers. These scan chains could also be part of modules that do not include an embedded controller. The top-level controller also provides an SE (Scan Enable), TM (Test Mode), CD (Capture Disable), CE (Clock Enable) signals that are connected, respectively, to the extSE, extTM, extCD and extCE ports of the modules with embedded controllers as well as to the control inputs of the other scan chains that are not part of any modules with embedded controllers. Control bus 126 is connected to the top-level test controller and includes inputs and outputs identical to those used for embedded test controllers. The control bus can be connected directly to circuit pins or connected to a Test Access Port (TAP). A typical example is the TAP described by the IEEE1149.1 standard which is well known in the art.

Simplified Model

An important aspect of the method of the present invention is that it produces a greatly simplified representation or model of the modules with embedded test controllers. The simplified model contains only the peripheral memory elements and the combinational logic between these memory elements and input and output ports of the modules. In the present invention, this "simplified model" can be annotated with detailed timing extracted from circuit layout. The simulation of the external test mode is as representative of the reality as if the entire circuit had been simulated. The method of creating the simplified model includes:

reading in the hierarchical description of the circuit;

identifying peripheral memory elements;

configuring the modules in external test mode;

identifying all peripheral logic, i.e., the gates in the fanin of all module outputs and all inputs of peripheral memory elements potentially contributing to determine the state of the outputs and memory elements during external test mode;

verifying that the state of module outputs and peripheral memory elements only depend on module inputs and peripheral memory elements;

verifying that all peripheral memory elements are connected in scan chains that area accessible from input/output ports of the module and that the scan chains do not include non-peripheral memory elements; and writing out a hierarchical description of the module that contains only the peripheral memory elements and peripheral logic, the hierarchical names of all signals and port names associated with the identified memory elements and logic gates of the simplified module description matching the names of the original description.

Sample Circuit Description C illustrates a simplified model description obtained by performing the above method on the hierarchical description of Sample Circuit Description B.

In the step of identifying the peripheral logic, it is necessary to consider all flip-flop inputs, such as, data input, clock inputs, asynchronous set/reset inputs, and so forth. A gate can potentially affect the state of a module output or a peripheral flip-flop if there exists a combination of module input states and flip-flop states such that a change at the output of the gate changes the state of the module output peripheral flip-flop. It is to be noted that this analysis is performed when the module input extTM which indicates that the module is configured in the external Test Mode is active, several combinations are not allowed and several gates in the fanin of module outputs and inputs of peripheral flip-flops might be excluded from the peripheral logic.

The step of writing out the hierarchical description must ensure that the hierarchical names match those of the original description so that detailed timing information available for the original description can be annotated on the simplified model during simulation. Thus, the timing used in the simplified model is the same as that of the full model and the simulation of the external test is representative of the full model.

Since all memory elements used to perform the test at the top-level of the circuit are functional memory elements, it is possible to test the paths between the modules at the functional speed of operation of the circuit, something that is not possible when test-dedicated memory elements are used at the module boundaries.

Although the present invention has been described in detail with regard to preferred embodiments and drawings of the invention, it will be apparent to those skilled in the art that various adaptions, modifications and alterations may be accomplished with departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

SAMPLE CIRCUIT DESCRIPTION A ORIGINAL CIRCUIT DESCRIPTION

```
module top (CLKA, CLKB, CLKC, D, Q, TM);
input CLKA, CLKB, CLKC;
input [0:4] D;
input TM;
output [0:4] Q;

AN210 U1 (.Y(N1), .A(D[1]), .B(D[2]));
AN310 U2 (.Y(N2), .A(N1), .B(D[3]), .C(N5));
NA210 U3 (.Y(N3), .A(N2), .B(N11));
MU111 U4 (.Y(N4), .A(D[4]), .B(N3), .S(TM));

// input periphery flip-flops
DTN12 flop1 (.CLK(CLKA), .D(D[0]), .Q(Q[0]));
DTN12 flop2 (.CLK(CLKB), .D(N1), .Q(N5));
DTN12 flop3 (.CLK(CLKB), .D(N2), .Q(N6));
DTN12 flop4 (.CLK(CLKC), .D(N4), .Q(N7));

// flip-flop which is output periphery because it fans out
// to an input periphery
DTN12 flop5 (.CLK(CLKB), .D(N9), .Q(N11));

OR210 U5 (.Y(N8), .A(N5), .B(N11));
AN210 U6 (.Y(N9), .A(N6), .B(N7));

// internal flip-flops
DTN12 flop6 (.CLK(CLKA), .D(N8), .Q(N10));
DTN12 flop7 (.CLK(CLKB), .D(Q[1]), .Q(N12));
DTN12 flop8 (.CLK(CLKC), .D(N12), .Q(N13));

// output periphery flip-flops
DTN12 flop9 (.CLK(CLKB), .D(N13), .Q(N14));
DTN12 flop10 (.CLK(CLKC), .D(N11), .Q(Q[1]));
DTN12 flop11 (.CLK(CLKA), .D(N10), .Q(Q[4]));

AN210 U9 (.Y(Q[2]), .A(Q[4]), .B(N14));
BU130 U10 (.Y(Q[3]), .A(N14));

endmodule
```

SAMPLE CIRCUIT DESCRIPTION B

MODIFIED CIRCUIT DESCRIPTION AFTER CONVERSION OF FUNCTIONAL MEMORY ELEMENTS TO SCANNABLE MEMORY ELEMENTS AND OF SELECTED MEMORY ELEMENTS TO PERIPHERAL MEMORY ELEMENTS

```
module top
  (CLKA,
  CLKB,
  CLKC,
  D,
  Q,
  TM,
  LV_SI0_CK1_F1,
  LV_SO0_CK1_F1,
  LV_SE_CK1,
  LV_CD1,
  LV_SI0_CK1_F1_ext,
  LV_SO0_CK1_F1_ext,
  LV_testmode,
  LV_SE_CK1_ext,
  LV_CD2_ext,
  LV_testmode_ext,
  LV_SI0_CK2_F1,
  LV_SO0_CK2_F1,
  LV_SE_CK2,
  LV_CD0,
  LV SI0_CK2_F1_ext,
  LV_SO0_CK2_F1_ext,
  LV_SE_CK2_ext,
  LV_CD3_ext,
  LV_CD0_ext,
  LV_SI0_CK3_F1,
  LV_SO0_CK3_F1,
  LV_SE_CK3,
  LV_SI0_CK3_F1_ext,
  LV_SO0_CK3_F1_ext,
  LV_SE_CK3_ext);

input CLKA;
input CLKB;
input CLKC;
input[0:4] D;
output[0:4] Q;
input TM;
input LV_SI0_CK1_F1;
output LV_SO0_CK1_F1;
input LV_SE_CK1;
input LV_CD1;
input LV_SI0_CK1_F1_ext;
output LV_SO0_CK1_F1_ext;
input LV_testmode;
input LV_SE_CK1_ext;
input LV_CD2_ext;
input LV_testmode_ext;
input LV_SI0_CK2_F1;
output LV_SO0_CK2_F1;
input LV_SE_CK2;
input LV_CD0;
input LV_SI0_CK2_F1_ext;
output LV_SO0_CK2_F1_ext;
input LV_SE_CK2_ext;
input LV_CD3_ext;
input LV_CD0_ext;
input LV_SI0_CK3_F1;
output LV_SO0_CK3_F1;
input LV_SE_CK3;
input LV_SI0_CK3_F1_ext;
output LV_SO0_CK3_F1_ext;
input LV_SE_CK3_ext;

wire N10;
wire N11;
wire N12;
wire LV_SE_CK3_or_LV_SE_CK3_ext;
wire N13;
wire LV_SE_CK2_or_LV_SE_CK2_ext;
wire N14;
wire[0:4] D;
wire LV_SE_CK1;
wire LV_SE_CK2;
wire LV_SE_CK3;
```

```
wire LV_SO0_CK3_F1_ext_1;
wire LV_SO0_CK1_F1_ext_1;
wire LV_SO0_CK2_F1_ext_1;
wire LV_SO0_CK3_F1_ext_0;
wire TM;
wire LV_SO0_CK1_F1_ext_0;
wire LV_SO0_CK2_F1_ext_0;
wire LV_SO0_CK2_F1_ext_3;
wire LV_SO0_CK2_F1_ext_2;
wire LV_testmode;
wire LV_SE_CK3_or_LV_CD1_or_LV_testmode_
    ext;
wire LV_SE_CK3_or_LV_testmode_ext;
wire LV_SE_CK1_or_LV_testmode_ext;
wire LV_CD0;
wire LV_CD1;
wire CLKA;
wire N1;
wire[0:4] Q;
wire CLKB;
wire N2;
wire LV_testmode_or_LV_SE_CK3_ext_or_LV_
    CD0_ext;
wire LV_SE_CK3_ext;
wire LV_testmode_or_LV_SE_CK2_ext;
wire N3;
wire CLKC;
wire LV_SE_CK1_ext;
wire LV_CD2_ext;
wire LV_testmode_or_LV_SE_CK1_ext_or_LV$_{CD2}$_
    ext;
wire LV_testmode_or_LV_SE_CK1_ext;
wire LV_SE_CK2_ext;
wire LV_CD3_ext;
wire LV_testmode_or_LV_SE_CK2_ext_or_LV$_{CD3}$_
    ext;
wire LV_CD0_ext;
wire LV_testmode_or_LV_SE_CK2_ext_or_LV_
    CD0_ext;
wire LV_SO0_CK3_F1;
wire LV_SI0_CK3_F1;
wire LV_SO0_CK1_F1;
wire LV_SI0_CK1_F1;
wire N4;
wire LV_SI0_CK2_F1;
wire LV_SO0_CK2_F1;
wire N5;
wire N6;
wire LV_SO0_CK3_F1_ext;
wire LV_SO0_CK1_F1_ext;
wire N7;
wire LV_SO0_CK2_F1_ext;
wire LV_SE_CK2_or_LV_CD_or_LV_testmode_ext;
wire N8;
wire LV_testmode_ext;
wire N9;
wire LV_SE_CK3_or_LV_CD1;
wire LV_SE_CK1_or_LV_CD1;
wire LV_SE_CK2_or_LV_CD0;
wire LV_SI0_CK3_F1_ext;
wire LV_SI0_CK1_F1_ext;
wire LV_SI0_CK2_F1_ext;

AN210 U1
    (.Y(N1),
     A(D[1]),
     .B(D[2]));

AN310 U2
    (.Y(N2),
     .A(N1),
     .B(D[3]),
     .C(N5));

NA210 U3
    (.Y(N3),
     .A(N2),
     .B(N11));

MU111 U4
    (.Y(N4),
     .A(D[4]),
     .B(N3),
     .S(TM));

OR210 U5
    (.Y(N8),
     .A(N5),
     .B(N11));

AN210 U6
    (.Y(N9),
     .A(N6),
     .B(N7));

AN210 U9
    (.Y(Q[2]),
     .A(Q[4]),
     .B(N14));

BU130 U10
    (.Y(Q[3]),
     .A(N14));

TDN20 flop6
    (.CLK(CLKA),
     .D(N8),
     .Q(N10),
     .SD(LV_SI0_CK1_F1),
     .SCAN(LV_SE_CK1_or_LV_CD1));

OR210 LV_or instance_LV_SE_CK1_or_LV_CD1
    (.Y(LV_SE_CK1_or_LV_CD1),
     .A(LV_SE_CK1),
     .B(LV_CD1));

assign LV_SO0_CK1_F1=N10;

TDN20_PD flop1
    (.CLK(CLKA),
     .D(D[0]),
     .Q(Q[0]),
     .SD(LV_SI0_CK1_F1_ext),
     .QZ(LV_SO0_CK1_F1_ext_0),
     .SCAN(LV_testmode_or_LV_SE_CK1_ext_or_
         LV_CD2_ext),
     .CE(LV_testmode_or_LV_SE_CK1_ext));

OR310 LV_or_instance_LV_testmode_or_LV_SE_
    CK1_ext_or_LV_CD2_ext
    (.Y(LV_testmode_or_LV_SE_CK1_ext_or_LV_
        CD2_ext),
```

```
        .A(LV_testmode),
        .B(LV_SE_CK1_ext),
        .C(LV_CD2_ext));

OR210 LV_or_instance_LV_testmode_or_LV_SE_
    CK1_ext
    (.Y(LV_testmode_or_LV_SE_CK1_ext),
        .A(LV_testmode),
        .B(LV_SE_CK1_ext));

TDN20_PD flop11
    (.CLK(CLKA),
        .D(N10),
        .Q(Q[4]),
        .SD(LV_SO0_CK1_F1_ext_0),
        .QZ(LV_SO0_CK1_F1_ext_1),
        .SCAN(LV_SE_CK1_or_LV_testmode_ext),
        .CE(LV_testmode_or_LV_SE_CK1_ext));

OR210 LV_or_instance_LV_SE_CK1_or_LV_
    testmode_ext
    (.Y(LV_SE_CK1_or_LV_testmode_ext),
        .A(LV_SE_CK1),
        .B(LV_testmode_ext));

assign LV_SO0_CK1_F1_ext=LV_SO0_CK1_F1_
    ext_1;
TDN20_PD flop7
    (.CLK(CLKB),
        .D(Q[1]),
        .Q(N12),
        .SD(LV_SI0_CK2_F1),
        .SCAN(LV_SE_CK2_or_LV_CD0),
        .CE(LV_SE_CK2));

OR210 LV_or_instance_LV_SE_CK2_or_LV_CD0
    (.Y(LV_SE_CK2_or_LV_CD0),
        .A(LV_SE_CK2),
        .B(LV_CD0));

assign LV_SO0_CK2_F1=N12;

TDN20_PD flop2
    (.CLK(CLKB),
        .D(N1),
        .Q(N5),
        .SD(LV_SI0_CK2_F1_ext),
        .QZ(LV_SO0_CK2_F1_ext_0),
        .SCAN(LV_testmode_or_LV_SE_CK2_ext_or_
            LV_CD3_ext),
        .CE(LV_SE_CK2_or_LV_SE_CK2_ext));

OR310 LV_or_instance_LV_testmode_or_LV_SE_
    CK2_ext_or_LV_CD3_ext
    (.Y(LV_testmode_or_LV_SE_CK2_ext_or_LV_
        CD3_ext),
        .A(LV_testmode),
        .B(LV_SE_CK2_ext),
        .C(LV_CD3_ext));

OR210 LV_or_instance_LV_SE_CK2_or_LV_SE_
    CK2_ext
    (.Y(LV_SE_CK2_or_LV_SE_CK2_ext),
        .A(LV_SE_CK2),
        .B(LV_SE_CK2_ext));

TDN20 flop3
    (.CLK(CLKB),
        .D(N2),
        .Q(N6),
        .SD(LV_SO0_CK2_F1_ext_0),
        .QZ(LV_SO0_CK2_F1_ext_1),
        .SCAN(LV_testmode_or_LV_SE_CK2_ext_or_
            LV_CD0_ext));

OR310 LV_or_instance_LV_testmode_or_LV_SE_
    CK2_ext_or_LV_CD0_ext
    (.Y(LV_testmode_or_LV_SE_CK2_ext_or_
        $LV_{CD0}$_ext),
        .A(LV_testmode),
        .B(LV_SE_CK2_ext),
        .C(LV_CO0_ext));

TDN20_PD flop5
    (.CLK(CLKB),
        .D(N9),
        .Q(N11),
        .SD(LV_SO0_CK2_F1_ext_1),
        .QZ(LV_SO0_CK2_F1_ext_2),
        .SCAN(LV_SE_CK2_or_LV_CD_or_LV_
            testmode_ext),
        .CE(LV_SE_CK2_or_LV_SE_CK2_ext));

OR310 LV_or_instance_LV_SE_CK2_or_LV_CD0_
    or_LV_testmode_ext
    (.Y(LV_SE_CK2_or_LV_CD_or_LV_testmode_
        ext),
        .A(LV_SE_CK2),
        .B(LV_CD0),
        .C(LV_testmode_ext));

TDN20_PD flop9
    (.CLK(CLKB),
        .D(N13),
        .Q(N14),
        .SD(LV_SO0_CK2_F1_ext_2),
        .QZ(LV_SO0_CK2_F1_ext_3),
        .SCAN(LV_SE_CK2_or_LV_CD0_or_LV_
            testmode_ext),
        .CE(LV_testmode_or_LV_SE_CK2_ext));

OR210 LV_or_instance_LV_testmode_or LV
    SE_CK2_ext
    (.Y(LV_testmode_or_LV_SE_CK2_ext),
        .A(LV_testmode),
        .B(LV_SE_CK2_ext));

assign LV_SO0_CK2_F1_ext=LV_SO0_CK2_F1_
    ext_3;

TDN20_PD flop8
    (.CLK(CLKC),
        .D(N12),
        .Q(N13),
        .SD(LV_SI0_CK3_F1),
        .SCAN(LV_SE_CK3_or_LV_CD1),
        .CE(LV_SE_CK3));

OR210 LV_or_instance_LV_SE_CK3_or_LV_CD1
    (.Y(LV_SE_CK3_or_LV_CD1),
        .A(LV_SE_CK3),
        .B(LV_CD1));
```

```
assign LV_SO0_CK3_F1=N13;

TDN20_PD flop4
    (.CLK(CLKC),
    .D(N4),
    .Q(N7),
    .SD(LV_SI0_CK3_F1_ext),
    .QZ(LV_SO0_CK3_F1_ext_0),
    .SCAN(LV_testmode_or_LV_SE_CK3_ext_or_
        LV_CD0_ext),
    .CE(LV_SE_CK3_or_LV_testmode_ext));

OR310 LV_or_instance_LV_testmode_or_LV_SE_
    CK3_ext_or_LV_CD0_ext
    (.Y(LV_testmode_or_LV_SE_CK3_ext_or_LV_
        CD0_ext),
    .A(LV_testmode),
    .B(LV_SE_CK3_ext),
    .C(LV_CD0_ext));

OR210 LV_or_instance_LV_SE_CK3_or_LV_
    testmode_ext
    (.Y(LV_SE_CK3_or_LV_testmode_ext),
    .A(LV_SE_CK3),
    .B(LV_testmode_ext));

TDN20_PD flop10
    (.CLK(CLKC),
    .D(N11),
    .Q(Qf[1]),
    .SD(LV_SO0_CK3_F1_ext_0),
    .QZ(LV_SO0_CK3_F1_ext_1),
    .SCAN(LV_SE_CK3_or_LV_CD1_or_LV_
        testmode_ext),
    .CE(LV_SE_CK3_or_LV_SE_CK3_ext));

OR310 LV_or_instance_LV_SE_CK3_or_LV_CD1_
    or_LV_testmode_ext
    (.Y(LV_SE_CK3_or_LV_CD1_or_LV_
        testmode_ext),
    .A(LV_SE_CK3),
    .B(LV_CD1),
    .C(LV_testmode_ext));

OR210 LV_or_instance_LV_SE_CK3_or_LV_SE_
    CK3_ext
    (.Y(LV_SE_CK3_or_LV_SE_CK3_ext),
    .A(LV_SE_CK3),
    .B(LV_SE_CK3_ext));

assign LV_SO0_CK3_F1_ext=LV_SO0_CK3_F1_
    ext_1;

endmodule

SAMPLE CIRCUIT DESCRIPTION C
        SIMPLIFIED MODEL DESCRIPTION
module top
(CLKA,
CLKB,
CLKC,
D,
Q,
TM,
LV_SI0_CK1_F1,
LV_SO0_CK1_F1,
LV_SE_CK1,
LV_CD1,
LV_SI0_CK1_F1_ext,
LV_SO0_CK1_F1_ext,
LV_testmode,
LV_SE_CK1_ext,
LV_CD2_ext,
LV_testmode_ext,
LV_SI0_CK2_F1,
LV_SO0_CK2_F1,
LV_SE_CK2,
LV_CD0,
LV_SI0_CK2_F1_ext,
LV_SO0_CK2_F1_ext,
LV_SE_CK2_ext,
LV_CD3_ext,
LV_CD0_ext,
LV_SI0_CK3_F1,
LV_SO0_CK3_F1,
LV_SE_CK3,
LV_SI0_CK3_F1_ext,
LV_SO0_CK3_F1_ext,
LV_SE_CK3_ext);

input CLKA;
input CLKB;
input CLKC;
input[0:4] D;
output[0:4] Q;
input TM;
input LV_SI0_CK1_F1;
output LV_SO0_CK1_F1;
input LV_SE_CK1;
input LV_CD1;
input LV_SI0_CK1_F1_ext;
output LV_SO0_CK1_F1_ext;
input LV_testmode;
input LV_SE_CK1_ext;
input LV_CD2_ext;
input LV_testmode_ext;
input LV_SI0_CK2_F1;
output LV_SO0_CK2_F1;
input LV_SE_CK2;
input LV_CD0;
input LV_SI0_CK2_F1_ext;
output LV_SO0_CK2_F1_ext;
input LV_SE_CK2_ext;
input LV_CD3_ext;
input LV_CD0_ext;
input LV_SI0_CK3_F1;
output LV_SO0_CK3_F1;
input LV_SE_CK3;
input LV_SI0_CK3_F1_ext;
output LV_SO0_CK3_F1_ext;
input LV_SE_CK3_ext;

wire N10;
wire N11;
wire N12;
wire LV_SE_CK3_or_LV_SE_CK3_ext;
wire N13;
wire LV_SE_CK2_or_LV_SE_CK2_ext;
wire N14;
wire[0:4] D;
wire LV_SE_CK1;
wire LV_SE_CK2;
``` wire LV_SE_CK3;
wire LV_SO0_CK3_F1_ext_1;
wire LV_SO0_CK1_F1_ext_1;
wire LV_SO0_CK2_F1_ext_1;
wire LV_SO0_CK3_F1_ext_0;
wire TM;
wire LV_SO0_CK1_F1_ext_0;
wire LV_SO0_CK2_F1_ext_0;
wire LV_SO0_CK2_F1_ext_3;
wire LV_SO0_CK2_F1_ext_2;
wire LV_testmode;
wire LV_SE_CK3_or_LV_CD1_or_LV_testmode_ext;
wire LV_SE_CK3_or_LV_testmode_ext;
wire LV_SE_CK1_or_LV_testmode_ext;
wire LV_CD0;
wire LV_CD1;
wire CLKA;
wire N1;
wire[0:4] Q;
wire CLKB;
wire N2;
wire LV_testmode_or_LV_SE_CK2_ext_or_LV_CD0_ext;
wire LV_CD0_ext;
wire LV_testmode_or_LV_SE_CK2_ext_or_LV_CD3_ext;
wire LV_CD3_ext;
wire LV_SE_CK2_ext;
wire LV_testmode_or_LV_SE_CK1_ext;
wire LV_testmode_or_LV_SE_CK1_ext_or_LV_CD2_ext;
wire LV_CD2_ext;
wire LV_SE_CK1_ext;
wire CLKC;
wire N3;
wire LV_testmode_or_LV_SE_CK2_ext;
wire LV_SE_CK3_ext;
wire LV_testmode_or_LV_SE_CK3_ext_or_LV_CD0_ext;
wire LV_SO0_CK2_F1;
wire LV_SI0_CK2_F1;
wire N4;
wire LV_SI0_CK1_F1;
wire LV_SO0_CK1_F1;
wire LV_SI0_CK3_F1;
wire LV_SO0_CK3_F1;
wire N5;
wire N6;
wire LV_SO0_CK2_F1_ext;
wire N7;
wire LV_SO0_CK1_F1_ext;
wire LV_SO0_CK3_F1_ext;
wire LV_testmode_ext;
wire N8;
wire LV_SE_CK2_or_LV_CD0_or_LV_testmode_ext;
wire N9;
wire LV_SE_CK1_or_LV_CD1;
wire LV_SE_CK3_or_LV_CD1;
wire LV_SE_CK2_or_LV_CD0;
wire LV_SI0_CK2_F1_ext;
wire LV_SI0_CK1_F1_ext;
wire LV_SI0_CK3_F1_ext;

AN210 U1
(.Y(N1),
.A(D[1]),
.B(D[2]));

AN310 U2
(.Y(N2),
.A(N1),
.B(D[3]),
.C(N5));

NA210 U3
(.Y(N3),
.A(N2),
.B(N11));

MU111 U4
(.Y(N4),
.A(D[4]),
.B(N3),
.S(TM));

AN210 U9
(.Y(Q[2]),
.A(Q[4]),
.B(N14));

BU130 U10
(.Y(Q[3]),
.A(N14));

TDN20_PD flop1

(.CLK(CLKA),
.D(D[0]),
.Q(Q[0]).
.SD(LV_SI0_CK1_F1_ext),
.QZ(LV_SO0_CK1_F1_ext_0),
.SCAN(LV_testmode_or_LV_SE_CK1_ext_or_LV_CD2_ext),
.CE(LV_testmode_or_LV_SE_CK1_ext));

OR310 LV_or_instance_LV_testmode_or_LV_SE_CK1_ext_or_LV_CD2_ext
(.Y(LV_testmode_or_LV_SE_CK1_ext_or_LV_CD2_ext),
.A(LV_testmode),
.B(LV_SE_CK1_ext),
.C(LV_CD2_ext));

OR210 LV_or_instance_LV_testmode_or_LV_SE_CK1_ext
(.Y(LV_testmode_or_LV_SE_CK1_ext),
.A(LV_testmode),
.B(LV_SE_CK1_ext));

TDN20_PD flop11
(.CLK(CLKA),
.D(N10),
.Q(Q[4]),
.SD(LV_SO0_CK1_F1_ext_0),
.QZ(LV_SO0_CK1_F1_ext_1),
.SCAN(LV_SE_CK1_or_LV_testmode_ext),
.CE(LV_testmode_or_LV_SE_CK1_ext));

OR210 LV_or_instance_LV_SE_CK1_or_LV_testmode_$_{ext}$
(.Y(LV_SE_CK1_or_LV_testmode ext),
.A(LV_SE_CK1),

```
.B(LV_testmode_ext));

assign LV_SO0_CK1_F1_ext=LV_SO0_CK1_F1_
    ext_1;

TDN20_PD flop2
(.CLK(CLKB),
.D(N1),
.Q(N5),
.SD(LV_SI0_CK2_F1_ext),
.QZ(LV_SO0_CK2_F1_ext_0),
.SCAN(LV_testmode_or_LV_SE_CK2_ext_or_LV_
    CD3_ext),
.CE(LV_SE_CK2_or_LV_SE_CK2_ext));

OR310 LV_or_instance_LV_testmode_or_LV_SE_
    CK2_ext_or_LV_CD3_ext
(.Y(LV_testmode_or_LV_SE_CK2_ext_or_LV$_{CD3\_}$
    ext),
.A(LV_testmode),
.B(LV_SE_CK2_ext),
.C(LV_CD3_ext));

OR210 LV_or_instance_LV_SE_CK2_or_LV_SE_
    CK2_ext
(.Y(LV_SE_CK2_or_LV_SE_CK2_ext),
.A(LV_SE_CK2),
.B(LV_SE_CK2_ext));

TDN20 flop3
(.CLK(CLKB),
.D(N2),
.Q(N6),
.SD(LV_SO0_CK2_F1_ext_0),
.QZ(LV_SO0_CK2_F1_ext_1),
.SCAN(LV_testmode_or_LV_SE_CK2_ext_or_LV_
    CD0_ext));

OR310 LV_or_instance_LV_testmode_or_LV_SE_
    CK2_ext or_LV_CD0_ext
(.Y(LV_testmode_or_LV_SE_CK2_ext_or_LV_
    CD0_ext),
.A(LV_testmode),
.B(LV_SE_CK2_ext),
.C(LV_CD0_ext));

TDN20_PD flop5
(.CLK(CLKB),
.D(N9),
.Q(N11),
.SD(LV_SO0_CK2_F1_ext_1),
.QZ(LV_SO0_CK2_F1_ext_2),
.SCAN(LV_SE_CK2_or_LV_CD_or_LV_testmode_
    ext),
.CE(LV_SE_CK2_or_LV_SE_CK2_ext));

OR310 LV_or_instance_LV_SE_CK2_or_LV_CD0_
    or_LV_testmode_ext
(.Y(LV_SE_CK2_or_LV_CD0_or_LV_testmode_
    ext),
.A(LV_SE_CK2),
.B(LV_CD0),
.C(LV_testmode_ext));

TDN20_PD flop9
(.CLK(CLKB),
.D(N13),
.Q(N14),
.SD(LV_SO0_CK2_F1_ext_2),
.QZ(LV_SO0_CK2_F1_ext_3),
.SCAN(LV_SE_CK2_or_LV_CD0_or_LV_
    testmode_ext),
.CE(LV_testmode_or_LV_SE_CK2_ext));

OR210 LV_or_instance_LV_testmode_or_LV_SE_
    CK2_ext
(.Y(LV_testmode_or_LV_SE_CK2_ext),
.A(LV_testmode),
.B(LV_SE_CK2_ext));

assign LV_SO0_CK2_F1_ext=LV_SO0_CK2_F1_
    ext_3;

TDN20_PD flop4
(.CLK(CLKC),
.D(N4),
.Q(N7),
.SD(LV_SI0_CK3_F1_ext),
.QZ(LV_SO0_CK3_F1_ext_0),
.SCAN(LV_testmode_or_LV_SE_CK3_ext_or_LV
    CD0 ext),
.CE(LV_SE_CK3_or_LV_testmode_ext));

OR310 LV_or_instance_LV_testmode_or_LV_SE_
    CK3_ext_or_LV_CD0_ext
(.Y(LV_testmode_or_LV_SE_CK3_ext_or_LV_
    CD0_ext),
.A(LV_testmode),
.B(LV_SE_CK3_ext),
.C(LV_CD00ext));

OR210 LV_or_instance_LV_SE_CK3_or_LV_
    testmode_ext
(.Y(LV_SE_CK3_or_LV_testmode_ext),
.A(LV_SE_CK3),
.B(LV_testmode_ext));

TDN20_PD flop10
(.CLK(CLKC),
.D(N11),
.Q(Q[1]),
.SD(LV_SO0_CK3_F1_ext_0),
.QZ(LV_SO0_CK3_F1_ext_1),
.SCAN(LV_SE CK3_or_LV_CD1_or_LV_testmode_
    ext),
.CE(LV_SE_CK3_or_LV_SE_CK3_ext));

OR310 LV_or_instance_LV_SE_CK3_or_LV_CD1_
    or_LV_testmode_ext
(.Y(LV_SE_CK3_or_LV_CD1_or_LV_testmode_
    ext),
.A(LV_SE_CK3),
.B(LV_CD1),
.C(LV_testmode_ext));

OR210 LV_or_instance_LV_SE_CK3_or_LV_SE_
    CK3_ext
(.Y(LV_SE_CK3_or_LV_SE_CK3_ext),
.A(LV_SE_CK3),
.B(LV_SE_CK3_ext));

assign LV_SO0_CK3_F1_ext=LV_SO0_CK3_F1_
    ext_1;

endmodule
```

We claim:

1. A method for use in the hierarchical design of integrated circuits forming a circuit having at least one module, each said module having functional memory elements and combinational logic, said method comprising:

reading in a description of said circuit;

replacing the description of each functional memory element of said modules with a description of a scannable memory element configurable in scan mode and capture mode;

partitioning each said module into an internal partition and a peripheral partition by converting the description of selected scannable functional memory elements into a description of scannable peripheral memory elements which are configurable in an internal test mode, an external test mode and a normal operation mode;

modifying the description of modules in said circuit description so as to arrange said memory elements into scan chains in which:

peripheral and internal scannable memory elements of each module are controlled by an associated module test controller when configured in internal test mode; and scannable peripheral memory elements of each module are controlled by a top-level test controller when configured in an external test mode; and verifying the correct operation of said internal test mode and said external test mode of said circuit.

2. A method as defined in claim 1, said step of partitioning said modules including:

identifying input peripheral memory elements by searching all memory elements that have at least one module input in the fanin of their data input;

identifying output peripheral memory elements by searching all memory elements that have at least one module output or an input peripheral memory element in the fanout of their data output;

modifying said circuit description so as to arrange identified input and output peripheral memory elements in at least one scan chain; and adding to said circuit description a description of control logic associated with the at least one scan chain for configuring the peripheral memory elements in an internal test mode, an external test mode and a normal operation mode.

3. A method as defined in claim 2, said identifying input and output peripheral memory elements including determining the memory element type of each identified input and output peripheral memory element and for each identified memory element which is a source or a recipient of a cross-domain signal, specifying a priority data style memory element.

4. A method as defined in claim 2, said identifying input and output peripheral memory elements including determining the memory element type of each identified input and output peripheral memory element and for each identified memory element which is a source or a recipient of a cross-domain signal or which is the source of multi-cycle signal, specifying a priority data style memory element and specifying a normal style memory element for all other memory element types.

5. A method as defined in claim 2, said adding a description of control logic including, for each input peripheral memory element, adding a description of control logic which generates memory element configuration control signals according to the control logic delineated in Table 4.

6. A method as defined in claim 2, said adding a description of control logic including, for each output peripheral memory element, adding a description of control logic which generates memory element configuration control signals control logic delineated in Table 3.

7. A method as defined in claim 2, further including testing said circuit including configuring said modules in an internal test mode and performing an internal test on at least one module; and configuring said modules in an external test mode and performing an external test on said circuit to test peripheral logic of all modules and remaining logic of the circuit.

8. A method as defined in claim 7, said internal test including:

configuring at least one of said modules in an internal test mode including configuring input peripheral memory elements in either a hold mode or a shift mode; and configuring output peripheral memory elements and internal memory elements in shift mode;

shifting in a test stimulus into said memory elements;

configuring said output peripheral memory elements and internal memory elements in capture mode for at least one clock cycle of a clock applied thereto for capturing the response of the circuit to said test stimulus;

configuring output peripheral memory elements and internal memory elements in shift mode;

shifting out the output response;

analyzing the output response; and repeating said internal test as many times as required to achieve sufficient test coverage of the modules.

9. A method as defined in claim 7, said external test including:

configuring output peripheral memory elements in either a hold mode or a shift mode;

configuring input peripheral memory elements and internal memory elements in shift mode;

shifting in a test stimulus into said memory elements;

configuring said input peripheral memory elements and internal memory elements in capture mode for at least one clock cycle of a clock applied thereto for capturing the response of the circuit to said test stimulus;

configuring input peripheral memory elements and internal memory elements in shift mode;

shifting out the output response; and analyzing the output response.

10. A method as defined in claim 1, said step of partitioning said modules further including adding to said circuit description, a description of test-dedicated memory elements connected to module inputs which do not have a peripheral memory element.

11. A method as defined in claim 10, said step of adding test-dedicated memory elements to module inputs including:

counting the number of gates and memory elements in the fanout of module inputs and in the fanin cone of module outputs; and adding to said circuit description a description of a test-dedicated peripheral memory element connected to each module input in which the number of gates in the fanout of said module input exceeds a predetermined number and adding to said circuit description a description of a test-dedicated peripheral memory element to module output in which the number of gates in the fanin to said module output exceeds a predetermined number.

12. A method as defined in claim 1, said step of verifying the internal and external test modes further including generating a simplified model for the modules to verify said external test mode.

13. A method as defined in claim 12, said step of generating a simplified model for the modules to verify the external test mode including:
configuring the modules in external test mode;
identifying all peripheral logic in the fanin of all module outputs and all inputs of peripheral memory elements, potentially contributing to determination of the state of the outputs and memory elements during external test mode;
verifying that the state of module outputs and peripheral memory elements depend only on module inputs and peripheral memory elements;
verifying that all peripheral memory elements are connected in at least one scan chain that is accessible from input/output ports of the module and that each at least one scan chain does not include non-peripheral memory elements; and
writing out for each said module a hierarchical description that contains only the peripheral memory elements and peripheral logic using the same hierarchical names of all signals and ports associated with the identified memory elements and logic gates in the simplified module description as in the original description.

14. A method as defined in claim 1, further including inserting into said circuit description, a description of a test controller associated with at least one of said modules for generating and applying memory element mode control signals to memory elements in said at least one module.

15. A method for use in the hierarchical design of integrated circuits forming a circuit having at least one module, reach said module having functional memory elements and combinational logic, said method comprising:
reading in a description of said circuit;
replacing the description of each functional memory element of said modules with a description of a scannable memory element configurable in scan mode and capture mode;
partitioning each said module into an internal partition and a peripheral partition by converting the description of selected scannable functional memory elements into a description of scannable peripheral memory elements which are configurable in an internal test mode, an external test mode and a normal operation mode;
said partitioning each said module including:
identifying input peripheral memory elements by searching all memory elements that have at least one module input in the fanin of their data input;
identifying output peripheral memory elements by searching all memory elements that have at least one module output or an input peripheral memory element in the fanout of their data output;
modifying said circuit description so as to arrange identified input and output peripheral memory elements in at least one scan chain; and
adding to said circuit description, a description of control logic associated with the at least one scan chain for configuring the peripheral memory elements in an internal test mode, an external test mode and a normal operation mode;
modifying the description of modules in said circuit description so as to arrange said memory elements into scan chains in which:
peripheral and internal scannable memory elements of each module are controlled by an associated module test controller when configured in internal test mode; and
scannable peripheral memory elements of each module are controlled by a top-level test controller when configured in an external test mode; and
verifying the correct operation of said internal test mode and said external test mode of said circuit.

16. A method as defined in claim 15, said identifying input and output peripheral memory elements including determining the memory element type of each identified input and output peripheral memory element and for each identified memory element which is a source or a recipient of a cross-domain signal, specifying a priority data style memory element.

17. A method as defined in claim 15, said identifying input and output peripheral memory elements including determining the memory element type of each identified input and output peripheral memory element and for each identified memory element which is a source or a recipient of a cross-domain signal or which is the source of multi-cycle signal, specifying a priority data style memory element and specifying a normal style memory element for all other memory element types.

18. A method as defined in claim 15, said adding a description of control logic including, for each input peripheral memory element, adding a description of control logic which generates memory element configuration control signals according to the control logic delineated in Table 4.

19. A method as defined in claim 18, said adding a description of control logic including, for each output peripheral memory element, adding a description of control logic which generates memory element configuration control signals control logic delineated in Table 3.

20. A method as defined in claim 15, further including testing said circuit including
configuring said modules in an internal test mode and performing an internal test on at least one module; and
configuring said modules in an external test mode and performing an external test on said circuit to test peripheral logic of all modules and remaining logic of the circuit.

21. A method as defined in claim 20, said internal test including configuring at least one of said modules in an internal test mode including configuring input peripheral memory elements in either a hold mode or a shift mode; and
configuring output peripheral memory elements and internal memory elements in shift mode;
shifting in a test stimulus into said memory elements;
configuring said output peripheral memory elements and internal memory elements in capture mode for at least one clock cycle of a clock applied thereto for capturing the response of the circuit to said test stimulus;
shifting out the output response;
analyzing the output response; and
repeating said internal test as many times as required to achieve sufficient test coverage of the modules.

22. A method as defined in claim 21, said external test including:
configuring output peripheral memory elements in either a hold mode or a shift mode;
configuring input peripheral memory elements and internal memory elements in shift mode;
shifting in a test stimulus into said memory elements;

configuring said input peripheral memory elements and internal memory elements in capture mode for at least one clock cycle of a clock applied thereto for capturing the response of the circuit to said test stimulus;

shifting out the output response; and analyzing the output response.

23. A method as defined in claim 15, said step of partitioning said modules further including adding to said circuit description, a description of test-dedicated memory elements connected to module inputs which do not have a peripheral memory element.

24. A method as defined in claim 23, said step of adding test-dedicated memory elements to module inputs including:

counting the number of gates and memory elements in the fanout of module inputs and in the fanin cone of module outputs;

adding to said circuit description a description of a test-dedicated peripheral memory element connected to each module input in which the number of gates in the fanout of said module input exceeds a predetermined number and adding to said circuit description a description of a test-dedicated peripheral memory element to module output in which the number of gates in the fanin to said module output exceeds a predetermined number.

25. A method as defined in claim 15, said step of verifying the internal and external test modes further including generating a simplified model for the modules to verify said external test mode.

26. A method as defined in claim 25, said step of generating a simplified model for the modules to verify the external test mode including:

configuring the modules in external test mode;

identifying all peripheral logic in the fanin of all module outputs and all inputs of peripheral memory elements, potentially contributing to determination of the state of the outputs and memory elements during external test mode;

verifying that the state of module outputs and peripheral memory elements depend only on module inputs and peripheral memory elements;

verifying that all peripheral memory elements are connected in at least one scan chain that is accessible from input/output ports of the module and that each at least one scan chain does not include non-peripheral memory elements; and writing out for each said module a hierarchical description that contains only the peripheral memory elements and peripheral logic using the same hierarchical names of all signals and ports associated with the identified memory elements and logic gates in the simplified module description as in the original description.

27. A method as defined in claim 15, further including inserting into said circuit description, a description of a test controller associated with at least one of said modules for generating and applying memory element mode control signals to memory elements in said at least one module.

28. A method for use with an integrated circuit having at least one module, said circuit and modules having memory elements and combinational logic, the method including the steps of:

designing a scan testable circuit by reading in a description of said circuit;

replacing memory elements of said modules with scannable memory elements;

partitioning each said module into two partitions delimited by peripheral memory elements, said memory elements being configurable into an internal test mode, an external test mode and a normal mode of operation, said partitioning each said module including:

identifying input peripheral memory elements by searching all memory elements that have at least one module input in the fanin of its data input;

identifying output peripheral memory elements by searching all memory elements that have at least one module output or an input peripheral memory element in the fanout of their data output;

arranging the peripheral memory elements in at least one scan chain; and adding control logic to the at least one scan chain so that the peripheral memory elements are configurable in an internal test mode, an external test mode and a normal mode of operation; and said step of partitioning said modules further including adding test-dedicated memory elements to module inputs including:

counting the number of gates and memory elements in the fanout of module inputs and in the fanin cone of module outputs;

adding test-dedicated peripheral memory element to module inputs in which the number of gates in their fanout exceeds a predetermined number and adding test-dedicated peripheral memory element to module outputs in which the number of gates in their fanin exceeds a predetermined number;

arranging said memory elements into scan chains in which:

peripheral and internal scannable memory elements of each module are controlled by an associated module test controller during an internal test mode; and peripheral scannable memory elements of each module are controlled by a top-level test controller during an external test mode; and verifying the correct operation of both the internal test mode and external test mode of said circuit including, said step of verifying generating a simplified model for the modules to verify the external test mode, including:

configuring the modules in external test mode;

identifying all peripheral logic in the fanin of all module outputs and of all inputs of peripheral memory elements potentially contributing to determine the state of the outputs and memory elements during external test mode;

verifying that the state of module outputs and peripheral memory elements depend only on module inputs and peripheral memory elements;

verifying that all peripheral memory elements are connected in at least one scan chain that is accessible from input/output ports of the module and that each at least one scan chain does not include non-peripheral memory elements; and writing out for each said module a hierarchical description that contains only the peripheral memory elements and peripheral logic using the hierarchical names of all signals and ports associated with the identified memory elements and logic gates of the simplified module description matching the names of the original description testing said circuit including configuring said modules in an internal test mode and performing an internal test on at least one module; and configuring said modules in an external test mode and performing an external test on said circuit to test peripheral logic of all modules and remaining logic of the circuit each said internal and external tests including:
configuring peripheral memory elements and internal memory elements in a shift mode;
shifting in a test stimulus;
configuring said memory elements in a capture mode;
capturing the output response of the circuit;
shifting out the output response;
analyzing the output response;
repeating the last five steps as many times as required to achieve sufficient test coverage of the modules.

29. A system for use in the hierarchical design of integrated circuits forming a circuit having at least one module, each said module having functional memory elements and combinational logic, said system comprising:

means for reading a description of said circuit;

means for replacing the description of each functional memory element of said modules with a description of a scannable memory element configurable in scan mode and capture mode;

means for partitioning each said module into an internal partition and a peripheral partition by converting the description of selected scannable functional memory elements into a description of scannable peripheral memory elements which are configurable in an internal test mode, an external test mode and a normal operation mode;

means for modifying the description of modules in said circuit description so as to arrange said memory elements into scan chains in which:
peripheral and internal scannable memory elements of each module are controlled by an associated module test controller when configured in internal test mode; and
scannable peripheral memory elements of each module are controlled by a top-level test controller when configured in an external test mode; and means for verifying the correct operation of said internal test mode and said external test mode of said circuit.

30. A system as defined in claim 29, said means for partitioning said modules including:

means for identifying input peripheral memory elements by searching all memory elements that have at least one module input in the fanin of their data input;

means for identifying output peripheral memory elements by searching all memory elements that have at least one module output or an input peripheral memory element in the fanout of their data output;

means for modifying said circuit description so as to arrange identified input and output peripheral memory elements in at least one scan chain; and means for adding to said circuit description a description of control logic associated with the at least one scan chain for configuring the peripheral memory elements in an internal test mode, an external test mode and a normal operation mode.

31. A system as defined in claim 30, said means for identifying input and output peripheral memory elements including means for determining the memory element type of each identified input and output peripheral memory element and for each identified memory element which is a source or a recipient of a cross-domain signal, specifying a priority data style memory element.

32. A system as defined in claim 30, said means for identifying input and output peripheral memory elements including means for determining the memory element type of each identified input and output peripheral memory element and for each identified memory element which is a source or a recipient of a cross-domain signal or which is the source of multi-cycle signal, specifying a priority data style memory element and specifying a normal style memory element for all other memory element types.

33. A system as defined in claim 30, said means for adding a description of control logic being operable to, for each input peripheral memory element, adding a description of control logic which generates memory element configuration control signals according to the control logic delineated in Table 4.

34. A system as defined claim 30, said means for adding a description of control logic being operable to, for each output peripheral memory element, add a description of control logic which generates memory element configuration control signals control logic delineated in Table 3.

35. A system as defined in claim 30, further including means for testing said circuit including means for configuring said modules in an internal test mode and performing an internal test on at least one module; and means for configuring said modules in an external test mode and performing an external test on said circuit to test peripheral logic of all modules and remaining logic of the circuit.

36. A system as defined in claim 35, said means for performing an internal test including means for configuring at least one of said modules in an internal test mode including configuring input peripheral memory elements in either a hold mode or a shift mode; and means for configuring output peripheral memory elements and internal memory elements in shift mode;

means for shifting in a test stimulus into said memory elements;

means for configuring said output peripheral memory elements and internal memory elements in capture mode for at least one clock cycle of a clock applied thereto for capturing the response of the circuit to said test stimulus;

means for shifting out the output response; and means for analyzing the output response.

37. A system as defined in claim 35, said means for performing an external test including:

means for configuring output peripheral memory elements in either a hold mode or a shift mode;

means for configuring input peripheral memory elements and internal memory elements in shift mode;

means for shifting in a test stimulus into said memory elements;

means for configuring said input peripheral memory elements and internal memory elements in capture mode for at least one clock cycle of a clock applied thereto for capturing the response of the circuit to said test stimulus;

means for shifting out the output response; and means for analyzing the output response.

38. A system as defined in claim 29, said means for partitioning said modules further including means for adding to said circuit description, a description of test-dedicated memory elements connected to module inputs which do not have a peripheral memory element.

39. A system as defined in claim 38, said means for adding test-dedicated memory elements to module inputs including:
means for counting the number of gates and memory elements in the fanout of module inputs and in the fanin cone of module outputs; and
means for adding to said circuit description a description of a test-dedicated peripheral memory element connected to each module input in which the number of gates in the fanout of said module input exceeds a predetermined number and adding to said circuit description a description of a test-dedicated peripheral memory element to module output in which the number of gates in the fanin to said module output exceeds a predetermined number.

40. A system as defined in claim 29, said means for verifying the internal and external test modes further including means for generating a simplified model for the modules to verify said external test mode.

41. A system as defined in claim 40, said means for generating a simplified model for the modules to verify the external test mode including:
means for configuring the modules in external test mode;
means for identifying all peripheral logic in the fanin of all module outputs and all inputs of peripheral memory elements, potentially contributing to determination of the state of the outputs and memory elements during external test mode;
means for verifying that the state of module outputs and peripheral memory elements depend only on module inputs and peripheral memory elements;
means for verifying that all peripheral memory elements are connected in at least one scan chain that is accessible from input/output ports of the module and that each at least one scan chain does not include non-peripheral memory elements; and
means for writing out for each said module a hierarchical description that contains only the peripheral memory elements and peripheral logic using the same hierarchical names of all signals and ports associated with the identified memory elements and logic gates in the simplified module description as in the original description.

42. A system as defined in claim 29, further including means for inserting into said circuit description, a description of a module test controller associated with each said at least one of said modules for generating and applying memory element mode control signals to memory elements in said at least one module.

43. A system for use in the hierarchical design and testing of an integrated circuit having at least one module, said circuit and modules having memory elements and combinational logic, said system comprising:
means for reading in a description of said circuit;
means for replacing memory elements of said modules with scannable memory elements;
means for partitioning each said module into two partitions delimited by peripheral memory elements, said memory elements being configurable into an internal test mode, an external test mode and a normal mode of operation, said partitioning each said module including:
means for identifying input peripheral memory elements by searching all memory elements that have at least one module input in the fanin of its data input;
means for identifying output peripheral memory elements by searching all memory elements that have at least one module output or an input peripheral memory element in the fanout of their data output;
means for arranging the peripheral memory elements in at least one scan chain; and
means for adding control logic to the at least one scan chain so that the peripheral memory elements are configurable in an internal test mode, an external test mode and a normal mode of operation;
means for arranging said memory elements into scan chains in which:
peripheral and internal scannable memory elements of each module are controlled by an associated module test controller during an internal test mode;
peripheral scannable memory elements of each module are controlled by a top-level test controller during an external test mode; and
means for verifying the correct operation of both the internal test mode and external test mode of said circuit.

44. A system as defined in claim 43, further including means for testing said circuit including
means for configuring said modules in an internal test mode and performing an internal test on at least one module; and
means for configuring said modules in an external test mode and performing an external test on said circuit to test peripheral logic of all modules and remaining logic of the circuit.

45. A system as defined in claim 44, each said internal and external tests including:
configuring peripheral memory elements and internal memory elements in a shift mode;
shifting in a test stimulus;
configuring said memory elements in a capture mode;
capturing the output response of the circuit;
shifting out the output response;
analyzing the output response;
repeating the last five steps as many times as required to achieve sufficient test coverage of the modules.

46. A system as defined in claim 43, said means for partitioning said modules including:
means for identifying input peripheral memory elements by searching all memory elements that have at least one module input in the fanin of their data input;
means for identifying output peripheral memory elements by searching all memory elements that have at least one module output or an input peripheral memory element in the fanout of their data output;
means for arranging said peripheral memory elements in at least one scan chain; and
means for adding control logic to the at least one scan chain so that the peripheral memory elements are configurable in an internal test mode, an external test mode and a normal mode of operation.

47. A system as defined in claim 43, said means for partitioning said modules including means for adding test-dedicated memory elements to module inputs.

48. A hierarchical design and test method as defined in claim 47, said means for adding test-dedicated memory elements to module inputs including:
means for counting the number of gates and memory elements in the fanout of module inputs and in the fanin cone of module outputs; and means for adding test-dedicated peripheral memory element to module inputs in which the number of gates in their fanout exceeds a predetermined number and adding test-dedicated peripheral memory element to module outputs in which the number of gates in their fanin exceeds a predetermined number.

49. A system as defined in claim 43, said means for verifying the internal and external test modes further including means for generating a simplified model for the modules to verify the external test mode.

50. A system as defined in claim 49, said means for generating a simplified model for the modules to verify the external test mode including:
   means for configuring the modules in external test mode;
   means for identifying all peripheral logic in the fanin of all module outputs and all inputs of peripheral memory elements, potentially contributing to determine the state of the outputs and memory elements during external test mode;
   means for verifying that the state of module outputs and peripheral memory elements depend only on module inputs and peripheral memory elements;
   verifying that all peripheral memory elements are connected in at least one scan chain that is accessible from input/output ports of the module and that each at least one scan chain does not include non-peripheral memory elements; and
   means for writing out for each said module a hierarchical description that contains only the peripheral memory elements and peripheral logic using the hierarchical names of all signals and ports associated with the identified memory elements and logic gates of the simplified module description matching the names of the original description.

51. A system as defined in claim 43, further including means for providing a module test controller for each said module and a top-level test controller for said circuit.

52. A system for use in the hierarchical design and testing of an integrated circuit having at least one module, said circuit and modules having memory elements and combinational logic, said system comprising:
   means for designing a scan testable circuit including:
      means for reading in a description of said circuit;
      means for replacing memory elements of said modules with scannable memory elements;
      means for partitioning each said module into two partitions delimited by peripheral memory elements, said memory elements being configurable into an internal test mode, an external test mode and a normal mode of operation, said partitioning means including:
         means for identifying input peripheral memory elements by searching all memory elements that have at least one module input in the fanin of its data input;
         means for identifying output peripheral memory elements by searching all memory elements that have at least one module output or an input peripheral memory element in the fanout of their data output;
         means for arranging the peripheral memory elements in at least one scan chain; and
         means for adding control logic to the at least one scan chain so that the peripheral memory elements are configurable in an internal test mode, an external test mode and a normal mode of operation; and
      said partitioning means further including means for adding test-dedicated
         memory elements to module inputs including:
            means for counting the number of gates and memory elements in the fanout of module inputs and in the fanin cone of module outputs;
            means for adding test-dedicated peripheral memory element to module inputs in which the number of gates in their fanout exceeds a predetermined number and adding test-dedicated peripheral memory element to module outputs in which the number of gates in their fanin exceeds a predetermined number;
      means for arranging said memory elements into scan chains in which peripheral and internal scannable memory elements of each module are controlled by an associated module test controller during an internal test mode; and
      peripheral scannable memory elements of each module are controlled by a top-level test controller during an external test mode; and
      means for verifying the correct operation of both the internal test mode and external test mode of said circuit including, said step of verifying generating a simplified model for the modules to verify the external test mode, including:
         means for configuring the modules in external test mode;
         means for identifying all peripheral logic in the fanin of all module outputs and of all inputs of peripheral memory elements potentially contributing to determine the state of the outputs and memory elements during external test mode;
         means for verifying that the state of module outputs and peripheral memory elements depend only on module inputs and peripheral memory elements;
         verifying that all peripheral memory elements are connected in at least one scan chain that is accessible from input/output ports of the module and that each at least one scan chain does not include non-peripheral memory elements; and
         means for writing out for each said module a hierarchical description that contains only the peripheral memory elements and peripheral logic using the hierarchical names of all signals and ports associated with the identified memory elements and logic gates of the simplified module description matching the names of the original description;
   means for testing said circuit including
      means for configuring said modules in an internal test mode and performing an internal test on at least one module; and
      means for configuring said modules in an external test mode and performing an external test on said circuit to test peripheral logic of all modules and remaining logic of the circuit;
      means for performing said internal and external tests including:
         means for configuring peripheral memory elements and internal memory elements in a shift mode;
         means for shifting in a test stimulus;
         means for configuring said memory elements in a capture mode;
         means for shifting out the output response; and
         means for analyzing the output response.

53. An integrated circuit having a plurality of modules, each said module having functional memory elements and combinational logic, said integrated circuit comprising:

each said module being partitioned into an inner partition and a peripheral partition, said inner and peripheral partitions being delimited by peripheral memory elements, said peripheral memory elements being functional memory elements and being configurable in an internal test mode, an external test mode and a normal operating mode;

each said functional memory element and said peripheral memory element being configurable in shift mode for loading test stimuli thereinto and unloading test response data therefrom and in a capture mode for capturing response during a test of said circuit;

said internal partition having internal memory elements arranged into at least one internal memory element scan chain;

said peripheral memory elements including:
  input peripheral memory elements having at least one module input in the fanin of its data input; and
  output peripheral memory elements having at least one module output or an input peripheral memory element in the fanout of its data output;

said peripheral memory elements being arranged in at least one peripheral memory element scan chain which is separate from said internal memory element scan chain; and control logic means associated with each said at least one peripheral memory element scan chain responsive to control signals for configuring said peripheral memory elements in an internal test mode, an external test mode and a normal mode of operation.

54. An integrated circuit as defined in claim 53, further including a module test controller associated with each said module for generating said control signals.

55. An integrated circuit as defined in claim 53, each said functional memory element having a clock input, a Data Input, a serial input, a serial output and an Data Output and a Scan Enable control input for selectively connecting one of said Data input and said test stimulus input to said output.

56. An integrated circuit as defined in claim 53, each said peripheral memory element having a clock input, a data Input, a test stimulus input, an output and a Scan Enable input for selectively connecting one of said Data input and said test stimulus input to said output.

57. An integrated circuit as defined in claim 53, each said module test controller having a Test Mode input for receiving a test mode control signal, and means responsive to a test mode control signal for producing an internal test control signal and an external test control signal and applying said internal test control signal and an external test control signal to each said control logic means.

58. An integrated circuit as defined in claim 53, each said peripheral memory element being of a type selected from the group including a Normal type and a Priority Data type.

59. An integrated circuit as defined in claim 58, said Priority Data type memory element having a clock input, a data Input, a test stimulus input, an output, a scan enable input for selectively connecting one of said Data input and said test stimulus input to said output and a clock enable input for configuring said memory element in Hold mode.

60. An integrated circuit as defined in claim 53, each input peripheral memory element having an input which traverses a clock domain boundary and each output peripheral memory element having an output which traverses a clock domain boundary being a priority data type memory element having a flip-flop having a flip-flop input, a flip-flop output, and a clock input, said memory element having:

a Data Input,
a serial input,
an output connected to said flip-flop output,
a serial output;
a scan enable control input,
a clock enable control input,
first means responsive to said clock enable control input for selectively connecting one of said serial input input and said flip-flop output to a first selection output; and
second means responsive to said scan enable control input for selectively connecting one of said Data Input and said first selection output to said flip-flop input for configuring said memory element in Hold mode.

61. An integrated circuit as defined in claim 58, said Normal type memory element having a flip-flop having a flip-flop input, a flip-flop output, and a clock input, said memory element having:

a Data Input,
a serial input,
an output connected to said flip-flop output,
a serial output;
a scan enable control input, and
means responsive to said scan enable control input for selectively connecting one of said Data Input and said serial input to said flip-flop input for configuring said memory element in a shift mode or in a capture mode.

62. A program product for use in the hierarchical design of integrated circuits forming a circuit having at least one module, each the module having functional memory elements and combinational logic, the program product comprising:

a computer readable storage medium, means recorded on the medium for reading in a description of said circuit;

means recorded on the medium for replacing the description of each functional memory element of said modules with a description of a scannable memory element configurable in scan mode and capture mode;

means recorded on the medium for partitioning each said module into an internal partition and a peripheral partition by converting the description of selected scannable functional memory elements into a description of scannable peripheral memory elements which are configurable in an internal test mode, an external test mode and a normal operation mode;

means recorded on the medium for modifying the description of modules in said circuit description so as to arrange said memory elements into scan chains in which:
  peripheral and internal scannable memory elements of each module are controlled by an associated module test controller when configured in internal test mode; and
  scannable peripheral memory elements of each module are controlled by a top-level test controller when configured in an external test mode; and means recorded on the medium for verifying the correct operation of said internal test mode and said external test mode of said circuit.

63. A program product as defined in claim 62, said means recorded on the storage medium for partitioning said modules including:

means recorded on the storage medium for identifying input peripheral memory elements by searching all memory elements that have at least one module input in the fanin of their data input;

means recorded on the storage medium for identifying output peripheral memory elements by searching all memory elements that have at least one module output or an input peripheral memory element in the fanout of their data output;

means recorded on the storage medium for modifying said circuit description so as to arrange identified input and output peripheral memory elements in at least one scan chain; and means recorded on the storage medium for adding to said circuit description a description of control logic associated with the at least one scan chain for configuring the peripheral memory elements in an internal test mode, an external test mode and a normal operation mode.

64. A program product as defined in claim 63, said means recorded on the storage medium for identifying input and output peripheral memory elements including means recorded on the storage medium for determining the memory element type of each identified input and output peripheral memory element and, for each identified memory element which is a source or a recipient of a cross-domain signal, specifying a priority data style memory element.

65. A program product as defined in claim 63, said means recorded on the storage medium for identifying input and output peripheral memory elements including determining the memory element type of each identified input and output peripheral memory element and for each identified memory element which is a source or a recipient of a cross-domain signal or which is the source of multi-cycle signal, specifying a priority data style memory element and specifying a normal style memory element for all other memory element types.

66. A program product as defined in claim 63, said means recorded on the storage medium for adding a description of control logic including means recorded on the storage medium for, for each input peripheral memory element, adding a description of control logic which generates memory element configuration control signals according to the control logic delineated in Table 4.

67. A program product as defined in claim 63, said means recorded on the storage medium for adding a description of control logic including means recorded on the storage medium for, for each output peripheral memory element, adding a description of control logic which generates memory element configuration control signals control logic delineated in Table 3.

68. A program product as defined in claim 63, further including means recorded on the storage medium for testing said circuit including:

means recorded on the storage medium for configuring said modules in an internal test mode and performing an internal test on at least one module; and means recorded on the storage medium for configuring said modules in an external test mode and performing an external test on said circuit to test peripheral logic of all modules and remaining logic of the circuit.

69. A program product as defined in claim 68, said internal test including:

means recorded on said medium for configuring at least one of said modules in an internal test mode including configuring input peripheral memory elements in either a hold mode or a shift mode; and means recorded on said medium for configuring output peripheral memory elements and internal memory elements in shift mode;

means recorded on said medium for shifting in a test stimulus into said memory elements;

means recorded on said medium for configuring said output peripheral memory elements and internal memory elements in capture mode for at least one clock cycle of a clock applied thereto for capturing the response of the circuit to said test stimulus;

means recorded on said medium for shifting out the output response; and means recorded on said medium for analyzing the output response.

70. A program product as defined in claim 68, said external test including:

means recorded on said medium for configuring output peripheral memory elements in either a hold mode or a shift mode;

means recorded on said medium for configuring input peripheral memory elements and internal memory elements in shift mode;

means recorded on said medium for shifting in a test stimulus into said memory elements;

means recorded on said medium for configuring said input peripheral memory elements and internal memory elements in capture mode for at least one clock cycle of a clock applied thereto for capturing the response of the circuit to said test stimulus;

means recorded on said medium for shifting out the output response; and means recorded on said medium for analyzing the output response.

71. A program product as defined in claim 62, said means recorded on the storage medium for partitioning said modules further including means recorded on the storage medium for adding to said circuit description, a description of test-dedicated memory elements connected to module inputs which do not have a peripheral memory element.

72. A program product as defined in claim 71, said means recorded on the storage medium for adding test-dedicated memory elements to module inputs including:

means recorded on the storage medium for counting the number of gates and memory elements in the fanout of module inputs and in the fanin cone of module outputs;

means recorded on the storage medium for adding to said circuit description a description of a test-dedicated peripheral memory element connected to each module input in which the number of gates in the fanout of said module input exceeds a predetermined number and adding to said circuit description a description of a test-dedicated peripheral memory element to module output in which the number of gates in the fanin to said module output exceeds a predetermined number.

73. A program product as defined in claim 62, said means recorded on the storage medium for verifying the internal and external test modes further including means recorded on the storage medium for generating a simplified model for the modules to verify said external test mode.

74. A program product as defined in claim 73, said means recorded on the storage medium for generating a simplified model for the modules to verify the external test mode including:

means recorded on the storage medium for configuring the modules in external test mode;

means recorded on the storage medium for identifying all peripheral logic in the fanin of all module outputs and all inputs of peripheral memory elements, potentially contributing to determination of the state of the outputs and memory elements during external test mode;

means recorded on the storage medium for verifying that the state of module outputs and peripheral memory elements depend only on module inputs and peripheral memory elements;

verifying that all peripheral memory elements are connected in at least one scan chain that is accessible from input/output ports of the module and that each at least one scan chain does not include non-peripheral memory elements; and means recorded on the storage medium for writing out for each said module a hierarchical description that contains only the peripheral memory elements and peripheral logic using the same hierarchical names of all signals and ports associated with the identified memory elements and logic gates in the simplified module description as in the original description.

75. A program product as defined in claim 62, further including means recorded on the storage medium for inserting into said circuit description, a description of a test controller associated with at least one of said modules for generating and applying memory element mode control signals to memory elements in said at least one module.

* * * * *

UNITED STATES PATENT AND TRADEMARK OFFICE
CERTIFICATE OF CORRECTION

PATENT NO. : 6,615,392 B1
DATED : September 2, 2003
INVENTOR(S) : Benoit Nadeau-Dostie It is certified that error appears in the above-identified patent and that said Letters Patent is hereby corrected as shown below:

Title page,
Item [75], Inventors, please delete "Pierre Gauther" and insert the correct spelling as -- Pierre Gauthier --.

Column 1,
Line 18, please insert -- be -- after "can".

Column 2,
Line 21, please delete "the".

Column 3,
Line 3, please delete "the".

Column 7,
Line 20, please replace "an" with -- a --.

Column 8,
Line 61, please delete "Q(Q[0]));" and insert -- .Q(Q[0])); --.

Column 9,
Lines 2 and 3, please insert -- .Q(Q[0]), -- below ".D(D[O])," and above ".SD(LV_S10 CK1_F1 ext),".
Line 6, delete the second occurrence of "or_".
Line 15, please insert -- constitute -- before "part".
Line 49, after "test, an", please insert -- output peripheral memory element must be configurable in a capture mode in order to --.

Column 10,
Line 49, please delete "additional" and insert -- addition --.
Line 56, please delete "A" and start a new paragraph with "Peripheral".

UNITED STATES PATENT AND TRADEMARK OFFICE
CERTIFICATE OF CORRECTION

PATENT NO. : 6,615,392 B1
DATED : September 2, 2003
INVENTOR(S) : Benoit Nadeau-Dostie It is certified that error appears in the above-identified patent and that said Letters Patent is hereby corrected as shown below:

Column 12,
Please delete Table 4 and insert the following:

Table 4

| Scan Flip-Flop style | Control Logic for Input Peripheral Flip-Flop | | |
| --- | --- | --- | --- |
| | During Internal Test | During External Test | Control Logic |
| Normal | Tm | Nm | SE=intTM \| extSE |
| Normal | Tm | Rx | SE=intTM \| extSE \| extCD |
| Priority Data | Tm | Tx Tx/Rx | SE=intTM \| extSE \| extCD CE=intTM \| extSE |
| Priority Data | Tm/Tx | Nm | SE= intTM \| extSE CE=intSE \| extTM |
| Priority Data | Tm/Tx | Rx | SE=intTM \| extSE \| extCD CE=intSE \| extTM |
| Priority Data | Tm/Tx | Tx Tx/Rx | SE=intTM \| extSE \| extCD CE=intSE \| extSE |

Column 13,
Line 6, please delete "a" after "for".
Line 7, please insert -- a -- after "be".

Column 15,
Line 33, please delete "is".
Line 35, please delete "shift" and insert -- shifted --.

Column 17,
Line 25, please delete "Q(Q[0]));" and insert -- .Q(Q[0])); --.

Column 19,
Line 30, please delete "LV $_{CD2\_}$ " and insert -- LV_CD2_ --.
Line 35, please delete "LV $_{CD3\_}$ " and insert -- LV_CD3_ --.
Line 53, please delete "CD" and insert -- CD0 --.
Line 67, please delete "A(D[1])," and insert -- .A(D[1]), --.

Column 22,
Line 13, please delete "LV $_{CD0}$_ext)," and insert -- LV_CD0_ext), --.
Line 16, please delete "CO0" and insert -- CD0 --.
Lines 24 and 30, please delete "CD" and insert -- CD0 --.

UNITED STATES PATENT AND TRADEMARK OFFICE
CERTIFICATE OF CORRECTION

PATENT NO. : 6,615,392 B1
DATED : September 2, 2003
INVENTOR(S) : Benoit Nadeau-Dostie It is certified that error appears in the above-identified patent and that said Letters Patent is hereby corrected as shown below:

Column 23,
Line 16, please delete "ext or" and insert -- ext_or --.
Line 31, please delete "f".

Column 26,
Line 65, please delete "testmode $_{ext}$" and insert -- testmode _ ext --.

Column 27,
Line 12, please delete "testmode or" and insert -- testmode_or --.
Line 18, please delete "LV $_{CD3\_}$" and insert --LV_CD3_ --.
Line 40, please delete "ext or" and insert -- ext_or --.
Line 53, please delete "CD" and insert -- CD0 --.

Column 28,
Line 32, please delete "CD00ext" and insert -- CD0_ext --.

Column 31,
Line 35, please delete "reach" and insert -- each --.

Column 41,
Line 37, please delete "an" and insert -- a --.

Column 42,
Line 8, please delete the second occurrence of "input".

Signed and Sealed this

Seventh Day of September, 2004

JON W. DUDAS
*Director of the United States Patent and Trademark Office*